United States Patent
Quick et al.

(10) Patent No.: US 8,067,303 B1
(45) Date of Patent: Nov. 29, 2011

(54) SOLID STATE ENERGY CONVERSION DEVICE

(75) Inventors: Nathaniel R. Quick, Lake Mary, FL (US); Aravinda Kar, Oviedo, FL (US)

(73) Assignee: Partial Assignment University of Central Florida, Orlando, FL (US)

( * ) Notice: Subject to any disclaimer, the term of this patent is extended or adjusted under 35 U.S.C. 154(b) by 166 days.

(21) Appl. No.: 11/900,488

(22) Filed: Sep. 12, 2007

Related U.S. Application Data

(60) Provisional application No. 60/844,044, filed on Sep. 12, 2006, provisional application No. 60/859,648, filed on Nov. 17, 2006.

(51) Int. Cl.
*H01L 31/12* (2006.01)
*H01L 21/26* (2006.01)

(52) U.S. Cl. .......... 438/535; 257/86; 257/E21.138; 257/E21.475

(58) Field of Classification Search .......... 257/525, 257/421, 428–432, 79, 86, 89, E21.138, E21.475; 438/48, 49, 57, 56, 54, 65, 69, 435, 487
See application file for complete search history.

(56) References Cited

U.S. PATENT DOCUMENTS

| | | | |
|---|---|---|---|
| 3,214,315 A | 10/1965 | Hildebrand | |
| 3,396,401 A | 8/1968 | Nonomura | |
| 3,419,321 A | 12/1968 | Barber et al. | |
| 3,605,469 A | 9/1971 | Queralto | |
| 3,788,120 A | 1/1974 | Takeo et al. | |
| 3,854,123 A | 12/1974 | Banach | |
| 3,865,564 A | 2/1975 | Jaeger et al. | |
| 3,874,240 A | 4/1975 | Rembaum | |
| 3,943,324 A | 3/1976 | Haggerty | |
| 3,944,640 A | 3/1976 | Haggerty et al. | |

(Continued)

FOREIGN PATENT DOCUMENTS

JP 358095830 A 6/1983

(Continued)

OTHER PUBLICATIONS

Salama et al., Laser Direct Write for Wide-band gap Semiconductor Fabrication: Doping, (Compound Semiconductors, 2003 International Symposium, pp. 102-103, Aug. 25-27, 2003).*

(Continued)

*Primary Examiner* — Thomas L Dickey
*Assistant Examiner* — Nikolay Yushin
(74) *Attorney, Agent, or Firm* — Frijouf, Rust & Pyle, P.A.

(57) ABSTRACT

A solid state energy conversion device and method of making is disclosed for converting energy between electromagnetic and electrical energy. The solid state energy conversion device comprises a wide bandgap semiconductor material having a first doped region. A thermal energy beam is directed onto the first doped region of the wide bandgap semiconductor material in the presence of a doping gas for converting a portion of the first doped region into a second doped region in the wide bandgap semiconductor material. A first and a second Ohmic contact are applied to the first and the second doped regions of the wide bandgap semiconductor material. In one embodiment, the solid state energy conversion device operates as a light emitting device to produce electromagnetic radiation upon the application of electrical power to the first and second Ohmic contacts. In another embodiment, the solid state energy conversion device operates as a photovoltaic device to produce electrical power between the first and second Ohmic contacts upon the application of electromagnetic radiation.

15 Claims, 11 Drawing Sheets

U.S. PATENT DOCUMENTS

| | | | |
|---|---|---|---|
| 3,945,318 A | 3/1976 | Landsman | |
| 3,965,328 A | 6/1976 | Locke | |
| 3,981,705 A | 9/1976 | Jaeger et al. | |
| 4,043,170 A | 8/1977 | Erodi et al. | |
| 4,135,902 A | 1/1979 | Oehrle | |
| 4,142,088 A | 2/1979 | Hirsch | |
| 4,159,414 A | 6/1979 | Suh et al. | |
| 4,215,263 A | 7/1980 | Grey et al. | |
| 4,309,224 A | 1/1982 | Shibata | |
| 4,339,285 A | 7/1982 | Pankove | |
| 4,372,989 A | 2/1983 | Menzel | |
| 4,383,843 A | 5/1983 | Iyengar | |
| 4,496,607 A | 1/1985 | Mathias | |
| 4,539,251 A | 9/1985 | Sugisawa et al. | |
| 4,547,650 A | 10/1985 | Arditty et al. | |
| 4,565,712 A | 1/1986 | Noguchi et al. | |
| 4,620,264 A | 10/1986 | Ushifusa et al. | |
| 4,624,934 A | 11/1986 | Kokubu et al. | |
| 4,663,826 A | 5/1987 | Baeuerle | |
| 4,691,091 A | 9/1987 | Lyons et al. | |
| 4,710,253 A | 12/1987 | Soszek | |
| 4,761,339 A | 8/1988 | Komatsu et al. | |
| 4,791,239 A | 12/1988 | Sirahata et al. | |
| 4,840,853 A | 6/1989 | Lio et al. | |
| 4,847,138 A | 7/1989 | Boylan et al. | |
| 4,860,442 A | 8/1989 | Alnsworth et al. | |
| 4,872,923 A | 10/1989 | Borodin | |
| 4,880,770 A | 11/1989 | Mir et al. | |
| 4,901,550 A | 2/1990 | Koide | |
| 4,912,087 A | 3/1990 | Aslam et al. | |
| 4,924,033 A | 5/1990 | Iyogi et al. | |
| 4,950,558 A | 8/1990 | Sarin | |
| 4,962,085 A | 10/1990 | deBarbadillo, II et al. | |
| 4,988,564 A | 1/1991 | D'Angelo et al. | |
| 5,015,618 A | 5/1991 | Levinson | |
| 5,055,967 A | 10/1991 | Sukonnik et al. | |
| 5,127,364 A | 7/1992 | Savkar et al. | |
| 5,145,741 A | 9/1992 | Quick | |
| 5,149,681 A | 9/1992 | Ohkawa et al. | |
| 5,180,440 A | 1/1993 | Siegel et al. | |
| 5,336,360 A | 8/1994 | Nordine | |
| 5,391,841 A | 2/1995 | Quick | |
| 5,405,481 A | 4/1995 | Licoppe et al. | |
| 5,459,098 A | 10/1995 | Maya | |
| 5,493,096 A | 2/1996 | Koh | |
| 5,549,971 A | 8/1996 | Nordine | |
| 5,629,532 A | 5/1997 | Myrick | |
| 5,680,200 A | 10/1997 | Sugaya et al. | |
| 5,695,828 A | 12/1997 | Ghosh et al. | |
| 5,733,609 A | 3/1998 | Wang | |
| 5,754,299 A | 5/1998 | Sugaya et al. | |
| 5,793,042 A | 8/1998 | Quick | |
| 5,823,039 A | 10/1998 | Umeda et al. | |
| 5,837,607 A | 11/1998 | Quick | |
| 5,847,418 A | 12/1998 | Nakamura et al. | |
| 5,889,234 A | 3/1999 | Ghosh et al. | |
| 5,906,708 A | 5/1999 | Robinson et al. | |
| 5,961,877 A | 10/1999 | Robinson et al. | |
| 6,025,609 A | 2/2000 | Quick | |
| 6,054,375 A | 4/2000 | Quick | |
| 6,064,081 A | 5/2000 | Robinson et al. | |
| 6,203,861 B1 | 3/2001 | Kar et al. | |
| 6,221,154 B1 | 4/2001 | Lee et al. | |
| 6,252,197 B1 | 6/2001 | Hoekstra et al. | |
| 6,255,671 B1 | 7/2001 | Bojarczuk et al. | |
| 6,271,576 B1 | 8/2001 | Quick | |
| 6,274,234 B1 | 8/2001 | Dujardin et al. | |
| 6,313,015 B1 | 11/2001 | Lee et al. | |
| 6,334,939 B1 | 1/2002 | Zhou et al. | |
| 6,407,443 B2 | 6/2002 | Chen et al. | |
| 6,526,327 B2 | 2/2003 | Kar et al. | |
| 6,621,448 B1 | 9/2003 | Lasky et al. | |
| 6,670,693 B1* | 12/2003 | Quick | 257/588 |
| 6,732,562 B2 | 5/2004 | Quick et al. | |
| 6,930,009 B1 | 8/2005 | Quick | |
| 6,939,748 B1* | 9/2005 | Quick | 438/142 |
| 7,237,422 B2 | 7/2007 | Quick | |
| 7,268,063 B1 | 9/2007 | Quick | |
| 7,419,887 B1 | 9/2008 | Quick | |
| 2001/0005036 A1* | 6/2001 | Porst et al. | 257/591 |
| 2002/0014631 A1* | 2/2002 | Iwata et al. | 257/89 |
| 2005/0089680 A1* | 4/2005 | Ando et al. | 428/331 |

FOREIGN PATENT DOCUMENTS

| | | |
|---|---|---|
| JP | 405024975 A | 2/1993 |
| WO | WO 03013757 | 2/2003 |

OTHER PUBLICATIONS

Nathaniel R. Quick, Laser Conversion of Ceramic Materials to Electroconductors, International Conference on Electronic Materials-1990, Materials Research Society, Newark, New Jersey, Sep. 17-19, 1990.

Nathaniel R. Quick, Direct Conversion of Conductors on Ceramic Substrates, International Society for Hybrid Microelectronics, ISHM 90 Proceedings 1990.

Nathaniel R. Quick and Jeffrey A. Phillips, Laser Processes for Integrating Substrate Fabrication, Proceedings of the International Conference on Lasers '91, The Society for Optical & Quantum Electronics, pp. 537-544 San Diego, CA Dec. 9-13, 1991.

Nathaniel R. Quick and Richard J. Matson, Characterization of a Ceramic Electrical Conductor Synthesized by a Laser Conversion Process, Proceedings of the International Conference on Lasers '91, The Society for Optical & Quantum Electronics, pp. 545-552 San Diego, CA Dec. 9-13, 1991.

Nathaniel R. Quick, Characterization of a Ceramic Sensor Synthesized by a Laser Conversion Process, Proceedings of the International Conference on Lasers '92. The Society for Optical & Quantum Electronics, pp. 881-887 Houston, Texas Dec. 7-10, 1992.

Nathaniel R. Quick, Characterization of a Ceramic Thermal Sensor Synthesized by a Laser Conversion Process, ICALEO '92 (International Congress on Applications of Lasers and Electro-Optics), vol. 76 Laser Materials Processing, Laser Institute of America, pp. 394-404 Oct. 25-29,1992.

D. K. Sengupta, N. R. Quick and A. Kar, Laser Direct Write of Conducting and Insulating Tracks in Silicon Carbide, Materials Research Society Symposium Proceedings vol. 624 pp. 127-133 2000.

D. K. Sengupta, N. R. Quick and A. Kar, Laser Conversion of Electrical Properties for Silicon Carbide Device Applications, Journal of Laser Applications., 2001, vol. 13, pp. 26-31.

I.A. Salama, N.R. Quick and A. Kar, Laser Doping of Silicon Carbide Substrates, Journal of Electronic Materials, vol. 31, 2002, pp. 200-208.

I.A. Salama, N. R. Quick and A. Kar, Microstructurel and electrical resistance analysis of laser-processed SiC substrates for wide bandgap semiconductor materials, Journal of Materials Science, vol. 40, 2005, pp. 3969-3980.

I.A. Salama, N. R. Quick and A. Kar, Laser Synthesis of Carbon-Rich SiC Nanoribbons, Journal of Applied Physics, vol. 93, 2003, pp. 9275-9281.

I.A. Salama, N. R. Quick, and A. Kar, Laser Direct Write Doping of Wide-Bandgap Semiconductor Materials,IEEE ISCS 2003 Proceedings.

A. Salama, C. F. Middleton, N. R. Quick G. D. Boreman and A. Kar, Laser-Metallized Silicon Carbide Schottky Diodes for Millimeter Wave Detection and Frequency Mixing, Symposium N1 Nitride and Wide Bandgap Semiconductors for Sensors, Photonics and Electronics IV, 204th Meeting of the Electrochemical Society, Orlando, Florida Oct. 12-16, 2003.

A. Salama, N. R. Quick and A. Kar, Laser Direct Metallization of Silicon Carbide without Metal Deposition, Symposium C, New Applications for Wide Bandgap Semiconductors, Materials Research Society, Apr. 23-24, 2003.

I. A. Salama, N. R. Quick and A. Kar, Laser-Induced Dopant Incorporation in Wide Bandgap Materials: SiC and GaN, ICALEO 2003 (International Congress on Applications of Lasers and Electro-Optics) Proceedings, 2003.

I.A. Salama, N.R. Quick, and A. Kar, Laser Direct Writing and Doping of Diamond-like Carbon, Polycrystalline Diamond and Single Crystal Silicon Carbide, Journal of Laser Applications, vol. 16, 2004, pp. 92-99.

Z. Tian, N. R. Quick and A. Kar, Laser Direct Write and Gas Immersion Laser Doping Fabrication of SiC Diodes, J: Silicon Carbide Materials, Procesing and Devices, Symposium J Apr. 14-15, 2004.

Z. Tian, N. R. Quick and A. KAr, Laser Doping of Silicon Carbon and PIN Diode Fabrication, 23rd International Congress on Applications of Lasers & Electro-Optics 2004.

A. Kar and N. R. Quick, Laser Processing for Wide Bandgap Semiconductor Device Fabrication, 2004 Meeting of Optical Society of America, 2004.

Z. Tian, I.A. Salama, N. R. Quick and A. Kar, Effects of Different laser Sources and Doping Methods used to Dope Silicon Carbide, Acta Materialla, vol. 53, 2005, pp. 2835-2844.

I.A. Salama, N. R. Quick and A. Kar, Microstructural and electrical resistance analysis of laser-processed SiC substrates for wide bandgap semiconductor materials, Journal of Materials Science, vol. 40, 2005, pp. 3969-3980.

Z. Tian, N. R. Quick and A. Kar; Characteristics of 6H-Silicon Carbide PIN Diodes Prototyping by Laser Doping, Journal of Electronic Materials, vol. 34, 2005, pp. 430-438.

Chong Zhang, A. Salama, N. R. Quick and A. Kar, Two-Dimensional Transient Modeling of CO2 Laser Drilling of Microvias in High Density Flip Chip Substrates, ICALEO 2005 (International Congress on Applications of Lasers and Electro-Optics), Laser Institute of America, Oct. 31-Nov. 3, 2005.

Chong Zhang. S. Bet, A. Salama, N. R. Quick and A. Kar, CO2 Laser Drilling of Microvias Using Diffractive Optics Techniques: I Mathematical Modeling, InterPack 05, The ASME/Pacific Rim Technical Conference on Integration and Packaging of MEMS, NEMS and Electronic Systems, San Francisco, CA Jul. 17-22, 2005.

Z. Tian, N. R. Quick and A. Kar, Laser Synthesis of Optical Structures in Silicon Carbide, 207th Meeting of the Electrochemical Society Proceedings, May 15-20, 2005.

Z. Tian, N.R. Quick and A. Kar, Laser-enhanced diffusion of nitrogen and aluminum dopants in silicon carbide, Acta Materiallia, vol. 54, 2006, pp. 4273-4283.

Z. Tian, N.R. Quick and A. Kar,Laser Direct Write Doping and Metallization Fabrication of Silicon Carbide PIN Diodes, Materials Science Forum, vols. 527-529, 2006, pp. 823-826.

S. Dakshinamurthy, N.R Quick and A. Kar, SiC-based Optical Interferometry at high pressures and temperatures for pressure and chemical sensing, Journal of Applied Physics, vol. 99, 2006, pp. 094902-1 to 094902-8.

C. Zhang, A. Salama, N. R. Quick and A. Kar, Modelling of Microvia Drilling with a Nd:YAG Laser, Journal of Physics D: Applied Physics 39 (2006) 3910-3918.

Z. Tian, N. R. Quick and A. Kar, Laser Endotaxy and PIN Diode Fabrication of Silicon Carbide, 2006 Spring Meting of Materials Research Society, 2006.

Z. Tian, N. R. Quick and A. Kar, Characteristics of Laser-Fabricated Diodes on Endotaxial Silicon Carbide Substrates, ESCRM (European Conference on Silicon Carbide and Related Materials) Proceedings 2006.

S. Bet, N.R. Quick and A. Kar, Laser Doping of Chromium and Selenium in p-type 4H-SiC, ICSCRM 2007 Symposium.

N. Quick, S. Bet and A. Kar, Laser Doping Fabrication of Energy Conversion Devices Materials Science and Technology 2007 Conference and Exhibition.

S. Bet, N.R. Quick and A. Kar, Effect of Laser Field and Thermal Stress on Diffusion in Laser Doping of SiC, Acta Materialia 55 (2007) 6816-6824.

S. Bet, N.R. Quick and A. Kar, Laser-Doping of Silicon Carbide for p-n Junction and LED Fabrication, Physics Status Solidi (A), vol. 204, No. 4, 2007, pp. 1147-1157.

S. Dakshinamurthy, N.R. Quick and A. Kar, Temperature-dependent Optical Properties of Silicon Carbide for Wireless Temperature Sensors, Journal of PhysicsD: Applied Physics 40 (2007)353-360.

S. Dakshinamurthy, N.R. Quick and A. Kar, High temperature optical properties of silicon carbide for wireless thermal sensing, Journal of Physics D: Applied Physics, vol. 40, No. 2, 2007, pp. 353-360.

Chong Zhang, A. Salama, N. R. Quick and A. Kar, Determination of Thermophysical Properties for Polymer Films using Conduction Analysis of Laser Heating, International Journal of Thermophysics, vol. 28, No. 3, Jun. 2007.

N. R. Quick, S. Bet and A. Kar, Laser Doping Fabrication of Energy Conversion Devices, Materials Science and Technology 2007 Conference and Exhibition, Sep. 19, 2007.

S. Bet, N.R. Quick and A. Kar, Laser Doping of Chromium in 6H-SiC for White Light Emitting Diodes, Laser Institute of America, Journal of Laser Applications Vo. 20, No. 1 pp. 43-49, Feb. 2008.

Z Tian, N. R. Quick and A. Kar, Laser Endotaxy in Silicon Carbide and PIN Diode Fabrication, Laser Institute of America, Journal of Laser Applications, vol. 20 No. 2 pp. 106-115, May 2008.

I. Salama, N. Quick and A. Kar, Laser Direct Write Doping of Wide-Bandgap Semiconductor Materials, ISCS 2003 Proceedings ,2003.

I. Salama, N. Quick and A. Kar, Laser Microprocessing of Wide Bandgap Materials, Proceedings of International Congress on Laser Advanced Materials Processing (LAMP 2002).

S. Bet, N. Quick and A. Kar, Laser Doping of Chromium and Selenium in P-Type 4H-SiC, Materials Science Forum vols. 600-603 (2009) pp. 627-630.

High-Temperature Solar Cell Development Geoffrey A. Landis, NASA John Glenn Research Center, Danielle Merritt and Ryne P. Raffaelle Rochester Institute of Technology, David Scheiman Ohio Aerospace Institute, Year 2005.

* cited by examiner

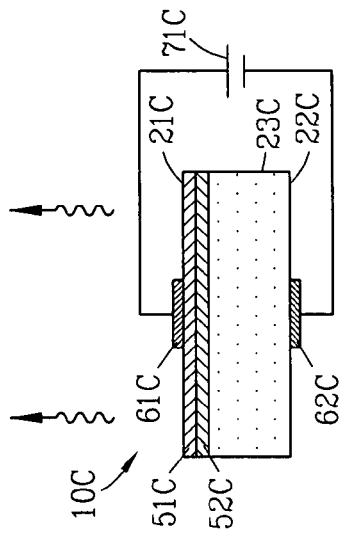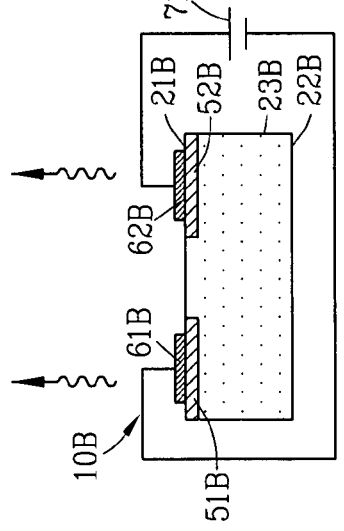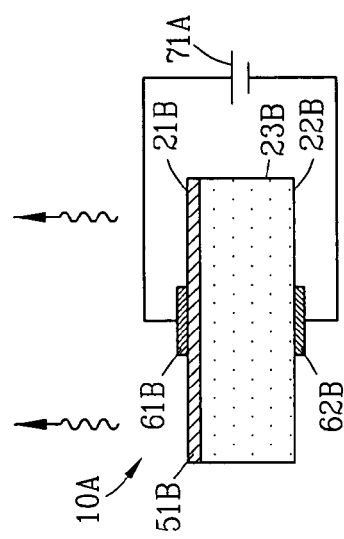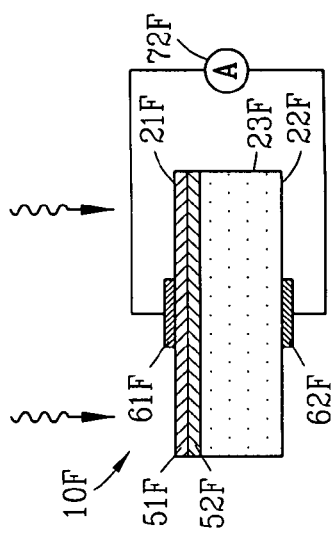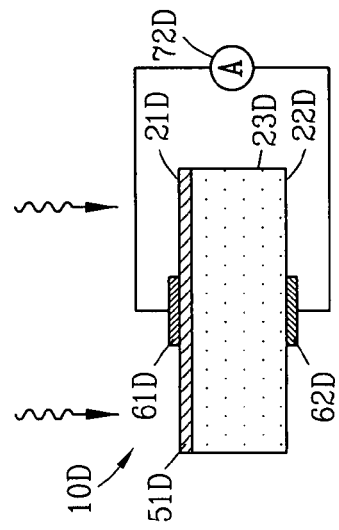

SOLID STATE ENERGY CONVERSION DEVICE

CROSS-REFERENCE TO RELATED APPLICATIONS

This application claims benefit of U.S. provisional application Ser. No. 60/844,044 filed Sep. 12, 2006 and U.S. Patent provisional application Ser. No. 60/859,648 filed Nov. 17, 2006. All subject matter set forth in provisional application Ser. No. 60/844,044 and provisional application Ser. No. 60/859,648 is hereby incorporated by reference into the present application as if fully set forth herein.

BACKGROUND OF THE INVENTION

1. Field of the Invention

This invention relates to solid state devices and more particularly to solid state devices for converting energy between electromagnetic and electrical energy such as light emitting device and photovoltaic device.

2. Background of the Invention

A variety of semiconductors including GaN (Gallium Nitride), GaP (Gallium Phosphide), AlGaAs (Aluminum Gallium Arsenide), InP (Indium Phosphide), Si (Silicon) and SiC are currently being studied for light emitting diode (LED) applications. Recently, efficient luminescence has been discovered in silicon, which is an indirect bandgap semiconductor, due to alteration of its defect states [Wai Lek Ng, et al, Nature, Vol. 410, Issue 8 (2001)]. However in SiC, an indirect bandgap wide-bandgap semiconductor (WBGS) generally emitting in the blue spectra, no efficient radiative isoelectronic trap has been discovered; consequently development of this LED material has languished. Other recent papers show that SiC LEDs have potential for high quantum efficiency [a) S. I. Vlaskina, "Silicon Carbide LED", Semiconductor Physics, Quantum Electronics & Optoelectronics, 2002, Vol. 5, No. 1, pp 71-75, b) S. Kamiyama et al, "Extremely high quantum efficiency of donor-acceptor-pair emission in N- and B-doped 6H—SiC, JAP, 99, 093108 (2006).].

P-type doping, particularly exhibiting low resistivity, has been a drawback for wide-bandgap semiconductor LED material candidates. Ion implantation and thermal diffusion are currently the most widely used techniques for doping semiconductors. The energy scattered by the decelerating ions leads to crystal damage by introducing point defects and the formation of amorphous material. Post ion implantation high temperature annealing isothermally heats the wafer inducing undesirable dopant diffusion in previously prepared under layers.

Doping is one of the challenges for wide bandgap semiconductors, particularly SiC, device fabrication due to its hardness, chemical inertness and the low diffusion coefficient of most impurities I. A. Salama, Ph.D. Dissertation, University of Central Florida, Spring (2003). Current doping methods used for SiC device fabrication include epilayer doping and ion implantation. Maximum doping concentration is limited by the solubility dopant depth is limited by the mass diffusion coefficient of the dopant in the wide bandgap semiconductor substrate. Epilayer doping is in situ doping during chemical vapor deposition epitaxial growth and is limited in SiC to nitrogen (N) or phosphorous (P) for n-type, aluminum (Al) or boron (B) for p-type and vanadium (V) for semi-insulating type. Ion implantation is the most common doping technique used for wide bandgap semiconductor devices. This process generates implantation-induced defect centers including amorphitization in the wafer and requires high annealing temperatures to remove these defects and to electrically activate the dopants. In SiC some defects remain after annealing at temperatures up to 1700° C. [Z. Tian., N. R. Quick. and A. Kar, Acta Materialia, Vol. 53, (2005), pp. 2835-2844]. Annealing at these temperatures can cause severe surface damage due to silicon sublimation and redistribution [Z. Tian, N. R. Quick and A. Kar, Acta Materialia, 54, 4273, (2006)]. In summary conventional doping processes limit the dopant species, dopant concentrations and create defects.

Photolithographic patterning is necessary to define the areas across the sample to be selectively doped. This usually requires up to 10-15 individual processing steps. Damage assisted sublimation etching (DASE) of Si and dopant out-diffusion are common problems observed during ion implantation of SiC. Techniques allowing direct doping without the requirement for prepatterning can become economically viable [a) S. J. Pearton, Processing of Wide Bandgap Semiconductors, 1st Edition, William Andrew Publishing, 2000; b) Z. C. Feng, J. H. Zhao, "Silicon Carbide: Materials, Processing, Devices", Optoelectronic Properties of Semiconductors and Superlattices, vol. 20, Taylor and Francis Books, Inc., 2004; c) M. E. Levinshtein et al, "Properties of Advanced Semiconductor Materials", Wiely-Interscience Publications, 2001].

U.S. Pat. No. 5,063,421 to Suzuki et al. discloses a silicon carbide light emitting diode having a p-n junction is disclosed which comprises a semiconductor substrate, a first silicon carbide single-crystal layer of one conductivity formed on the substrate, and a second silicon carbide single-crystal layer of the opposite conductivity formed on the first silicon carbide layer, the first and second silicon carbide layers constituting the p-n junction, wherein at least one of the first and second silicon carbide layers contains a tetravalent transition element as a luminescent center.

U.S. Pat. No. 5,243,204 to Suzuki et al. discloses a silicon carbide light emitting diodes having a p-n junction which is constituted by a p-type silicon carbide single-crystal layer and an n-type silicon carbide single-crystal layer formed thereon. In cases where light emission caused by recombination of free excitons is substantially utilized, at least a part of the n-type silicon carbide layer adjacent to the interface of the p-n junction is doped with a donor impurity at a concentration of $5 \times 10^{16}$ cm$^{-3}$ or lower. In cases where light emission caused by acceptor-associated recombination is substantially utilized, the p-type silicon carbide layer is doped with an acceptor impurity and at least a part of the n-type silicon carbide layer adjacent to the interface of the p-n junction is doped with a donor impurity at a concentration of $1 \times 10^{18}$ cm$^{-3}$ or higher. Also provided are a method for producing such silicon carbide light emitting diodes and a method for producing another silicon carbide light emitting diode.

U.S. Pat. No. 5,416,342 to Edmond et al. discloses a light emitting diode is disclosed that emits light in the blue portion of the visible spectrum with high external quantum efficiency. The diode comprises a single crystal silicon carbide substrate having a first conductivity type, a first epitaxial layer of silicon carbide on the substrate and having the same conductivity type as the substrate, and a second epitaxial layer of silicon carbide on the first epitaxial layer and having the opposite conductivity type from the first layer. The first and second epitaxial layers forming a p-n junction, and the diode includes Ohmic contacts for applying a potential difference across the p-n junction. The second epitaxial layer has side walls and a top surface that forms the top surface of the diode, and the second epitaxial layer has a thickness sufficient to increase the solid angle at which light emitted by the junction will radiate externally from the side walls, but less than the thickness at which internal absorption in said second layer would substantially reduce the light emitted from said top surface of the diode.

U.S. Pat. No. 6,900,465 to Nakamura et al. discloses a nitride semiconductor light-emitting device has an active layer of a single-quantum well structure or multi-quantum well made of a nitride semiconductor containing indium and gallium. A first p-type clad layer made of a p-type nitride semiconductor containing aluminum and gallium is provided in contact with one surface of the active layer. A second p-type clad layer made of a p-type nitride semiconductor containing aluminum and gallium is provided on the first p-type clad layer. The second p-type clad layer has a larger band gap than that of the first p-type clad layer. An n-type semiconductor layer is provided in contact with the other surface of the active layer.

U.S. Pat. No. 6,998,690 to Nakamura et al discloses a gallium nitride-based III-V Group compound semiconductor device has a gallium nitride-based III-V Group compound semiconductor layer provided over a substrate, and an Ohmic electrode provided in contact with the semiconductor layer. The Ohmic electrode is formed of a metallic material, and has been annealed.

U.S. Pat. No. 7,045,375 to Wu et al. discloses a white-light emitting device comprising a first PRS-LED and a second PRS-LED. The first PRS-LED has a primary light source to emit blue light and a secondary light source to emit red light responsive to the blue light; and the second PRS-LED has a primary light source to emit green light and a secondary light source for emitting red light responsive to the green light. Each of the primary light sources is made from an InGaN layer disposed between a p-type GaN layer and an n-type GaN layer. The secondary light sources are made from AlGaInP. The primary light source and the secondary light source can be disposed on opposite sides of a sapphire substrate. Alternatively, the second light source is disposed on the n-type GaN layer of the primary light source. The second light sources may comprise micro-rods of AlGaInP of same or different compositions.

Discussion of wide bandgap materials and the processing thereof are discussed in U.S. Pat. No. 5,145,741; U.S. Pat. No. 5,391,841; U.S. Pat. No. 5,793,042; U.S. Pat. No. 5,837,607; U.S. Pat. No. 6,025,609; U.S. Pat. No. 6,054,375; U.S. Pat. No. 6,271,576, U.S. Pat. No. 6,670,693, U.S. Pat. No. 6,930,009 and U.S. Pat. No. 6,939,748 are hereby incorporated by reference into the present application.

Therefore, it is an objective of this invention to provide a solid state energy conversion device and method of making a light emitting device to produce electromagnetic radiation upon the application of electrical power and/or a photovoltaic device to produce electrical power upon the application of electromagnetic radiation.

Another objective of this invention is to provide a solid state energy conversion device and method of making in a wide bandgap semiconductor for enabling operation of the solid state energy conversion device at elevated temperatures.

Another objective of this invention is to provide a solid state energy conversion device and method of making that reduces the materials and layers required to fabricate the solid state energy conversion device through the fabrication of a monolithic structure.

Another objective of this invention is to provide a solid state energy conversion device and method of making that incorporates a process for doping conventional and unconventional dopants in indirect wide bandgap semiconductors to create efficient radiative states to provide an efficient solid state energy conversion device.

Another objective of this invention is to provide a solid state energy conversion device and method of making that incorporates combinations of dopants which enables the tuning of solid state energy conversion device to a white light sensitivity of the solid state energy conversion device.

The foregoing has outlined some of the more pertinent objects of the present invention. These objects should be construed as being merely illustrative of some of the more prominent features and applications of the invention. Many other beneficial results can be obtained by modifying the invention within the scope of the invention. Accordingly other objects in a full understanding of the invention may be had by referring to the summary of the invention, the detailed description describing the preferred embodiment in addition to the scope of the invention defined by the claims taken in conjunction with the accompanying drawings.

SUMMARY OF THE INVENTION

The present invention is defined by the appended claims with specific embodiments being shown in the attached drawings. For the purpose of summarizing the invention, the invention relates to a solid state energy conversion device and a method of making for converting energy between electromagnetic and electrical energy. The solid state energy conversion device comprises a wide bandgap semiconductor material having a first doped region. A doping gas is applied to the first doped region of the wide bandgap semiconductor material. A thermal energy beam is directed onto the first doped region of the wide bandgap semiconductor material in the presence of the doping gas for converting a portion of the first doped region into a second doped region in the wide bandgap semiconductor material. A first and a second Ohmic contact are applied to the first and the second doped regions of the wide bandgap semiconductor material.

In a more specific embodiment of the invention, the step of providing a wide bandgap semiconductor material having a first doped region comprises providing a wide bandgap semiconductor material selected from the group consisting of silicon carbide, gallium nitride, aluminum nitride, diamond, diamond like carbon, boron nitride and gallium phosphide.

In another specific embodiment of the invention, the step of applying a doping gas to the first doped region of the wide bandgap semiconductor material comprises applying a doping gas selected from the group consisting of nitrogen, trimethylaluminum, Bis (ethyl benzene)-chromium, diethylselenium and Eurpoium 2,2,6,6, Tetramethyl 3,5, heptanedionate. Preferably, the step applying of a doping gas to the first doped region of the wide bandgap semiconductor material comprises applying a doping gas containing a dopant atom having a valence sufficiently greater that the valence of the wide bandgap semiconductor material to provide a multi-hole donor within the first doped region of the wide bandgap semiconductor material. In the alternative, the step applying of a doping gas to the first doped region of the wide bandgap semiconductor material comprises applying a doping gas containing a dopant atom having a valence sufficiently less that the valence of the wide bandgap semiconductor material to provide a multi-hole acceptor within the first doped region of the wide bandgap semiconductor material. The step of applying the first and second Ohmic contact may comprises applying the first and second Ohmic contact selected from the group consisting of indium, aluminum and laser synthesized carbon rich conductor.

The solid state energy conversion device may operate as a light emitting device or a photovoltaic device. The solid state energy conversion device produces electromagnetic radiation upon the application of electrical power to the first and second Ohmic contacts to operate as a light emitting device. The solid state energy conversion device produces electrical power between the first and second Ohmic contacts upon the application of electromagnetic radiation to operate as a photovoltaic device.

In another embodiment of the invention, the invention is incorporated into solid state energy conversion device comprising a wide bandgap semiconductor material having a first doped region. A second doped region is formed in situ within a portion of the first doped region by directing a thermal energy beam onto the first doped region in the presence of a doping gas for converting a portion of the first doped region into a second doped region. A first and a second Ohmic contact is connected to the first and the second doped regions of the wide bandgap semiconductor material. In one example, the solid state energy conversion device operates as a light emitting device to produce electromagnetic radiation upon the application of electrical power to the first and second Ohmic contacts. In another example, the solid state energy conversion device operates as a photovoltaic device to produce electrical power between the first and second Ohmic contacts upon the application of electromagnetic radiation.

In still another embodiment of the invention, the invention is incorporated into the process of making a solid state light emitting device in a substrate of a wide bandgap semiconductor material. The process comprises the steps of providing a wide bandgap semiconductor material having a first doped region. A doping gas is applied to the first doped region of the wide bandgap semiconductor material. A thermal energy beam is directed onto the first doped region of the wide bandgap semiconductor material in the presence of the doping gas for converting a portion of the first doped region into a second doped region in the wide bandgap semiconductor material. A first and a second Ohmic contact is applied to the first and the second doped regions of the wide bandgap semiconductor material. In one example, the solid state energy conversion device produces electromagnetic radiation upon the application of electrical power to the first and second Ohmic contacts to operate as a light emitting device having a color temperature that is between bright midday daylight and average daylight. In another example, the solid state energy conversion device produces electromagnetic radiation upon the application of electrical power to the first and second Ohmic contacts to operate as a light emitting device having a color temperature that is between bright midday daylight and average daylight.

In still another embodiment of the invention, the invention is incorporated into a solid state light emitting device comprising a wide bandgap semiconductor material having a first doped region. A second doped region is formed in situ within a portion of the first doped region by directing a thermal energy beam onto the first doped region in the presence of a doping gas for converting a portion of the first doped region into a second doped region. A first and a second Ohmic contact are connected to the first and the second doped regions of the wide bandgap semiconductor material.

In a further embodiment of the invention, the invention is incorporated into a solid state photovoltaic device comprising a wide bandgap semiconductor material having a first doped region. A second doped region is formed in situ within a portion of the first doped region by directing a thermal energy beam onto the first doped region in the presence of a doping gas for converting a portion of the first doped region into a second doped region. A first and a second Ohmic contact are connected to the first and the second doped regions of the wide bandgap semiconductor material.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which:

FIG. 3A is a side sectional view of a first example of a solid state energy conversion device formed in accordance with the present invention to provide a solid state light emitting device;

FIG. 3B is a side sectional view of a second example of a solid state energy conversion device formed in accordance with the present invention to provide a solid state light emitting device;

FIG. 3C is a side sectional view of a third example of a solid state energy conversion device formed in accordance with the present invention to provide a solid state light emitting device;

FIG. 4A is a side sectional view of a fourth example of a solid state energy conversion device formed in accordance with the present invention to provide a solid state photovoltaic device;

FIG. 4B is a side sectional view of a fifth example of a solid state energy conversion device formed in accordance with the present invention to provide a solid state photovoltaic device;

FIG. 4C is a side sectional view of a sixth example of a solid state energy conversion device formed in accordance with the present invention to provide a solid state photovoltaic device;

Similar reference characters refer to similar parts throughout the several Figures of the drawings.

DETAILED DISCUSSION

Figure 1:
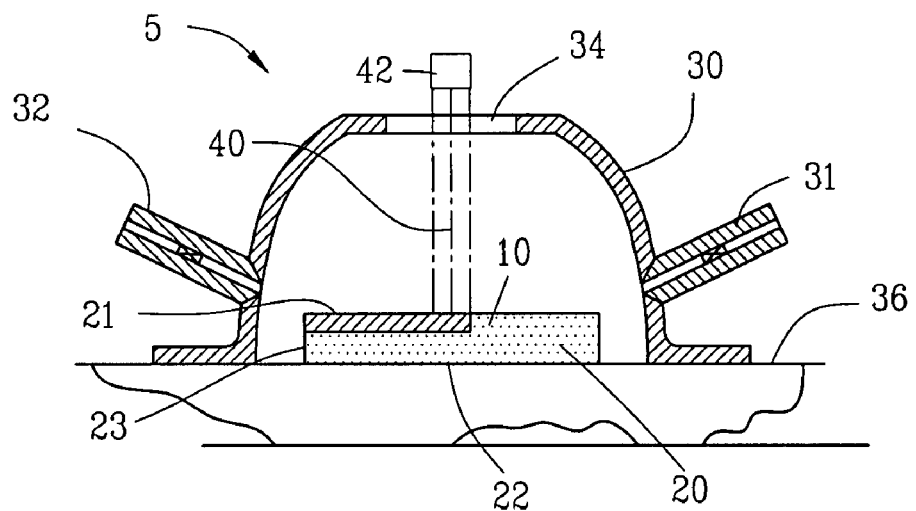
FIG. 1 is a side view of an air-tight chamber with a thermal energy beam impinging on a wide-bandgap semiconductor substrate for forming a solid state energy conversion device of the present invention.

FIG. 1 is a side view of an apparatus 5 for forming a solid state energy conversion device 10 on a wide-bandgap semiconductor substrate 20. The wide-bandgap semiconductor substrate 20 is shown located in an air-tight chamber 30. The chamber 30 has an inlet valve combination 31 and outlet valve 32 connected to the side wall of the chamber 30 for injecting and removing gases into and out of the chamber 30, respectively. The chamber 30 includes an airtight transmission window 34. The chamber 30 is disposed on a support member 36 forming an airtight seal therewith.

Figure 2:
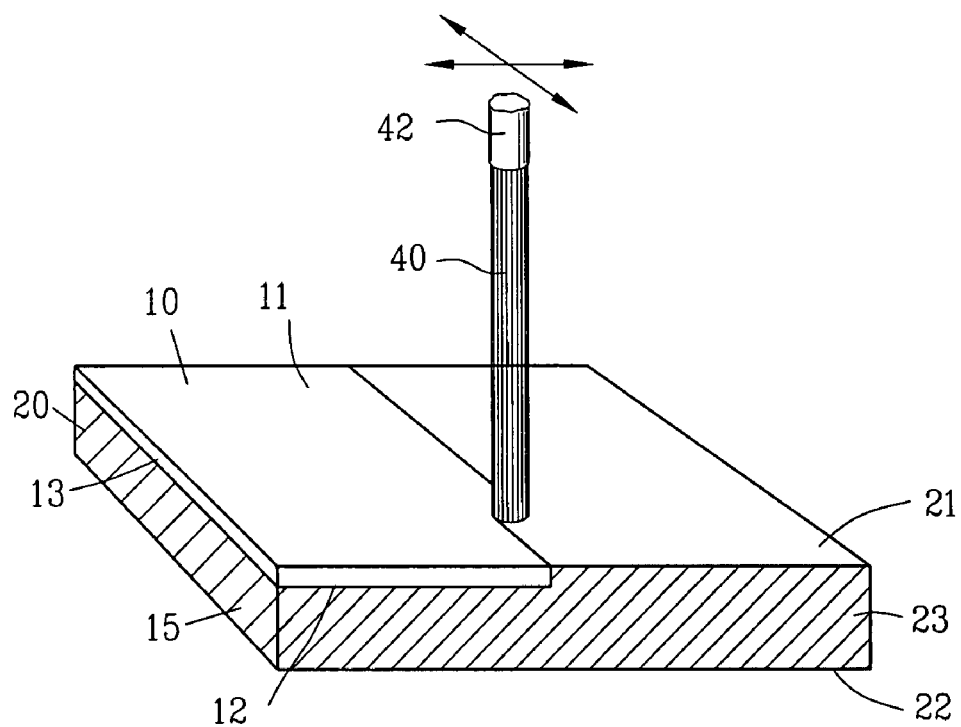
FIG. 2 is an enlarged isometric view of the substrate of FIG. 1.

FIG. 2 is an enlarged isometric view of the solid state energy conversion device 10 formed in situ within the wide-bandgap semiconductor substrate 20 shown in FIG. 1. The wide-bandgap semiconductor substrate 20 defines a first and a second side 21 and 22 and a peripheral edge 23. Although the wide-bandgap semiconductor substrate 20 is shown as a square, the present invention is not limited by the physical configuration of the wide-bandgap semiconductor substrate 20 as shown herein.

Preferably, the wide-bandgap semiconductor 20 has a bandgap greater than 2.0 electron volts. In one example, the wide-bandgap semiconductor 20 is selected from the group IV of the periodic table and having a bandgap greater than 2.0 electron volts. In a more specific example of the invention, the wide-bandgap semiconductor 20 is essentially a single crystal structure.

In still a more specific example of the invention, the wide-bandgap semiconductor 20 may be a single crystal compound. The elements of the single crystal compound selected are from the group III, the group IV and the group V of the periodic table and having bandgap greater than 2.0 electron volts. Preferably, one element of the compound has a higher melting point element than the other element of the compound. Specific examples of the wide-bandgap semiconductor compound are selected from the group consisting of Aluminum Nitride, Silicon Carbide, Boron Nitride, Gallium Nitride, diamond, diamond like carbon (DLC) and Gallium Phosphide.

A thermal energy beam 40 is shown emanating from a source 42 and passing through the airtight transmission window 34 to impinge on the first surface 21 of the wide-bandgap semiconductor substrate 20. In one example, the thermal energy beam 40 is a beam of charged particles such as a beam of electrons or a beam of ions. In another example, the thermal energy beam 40 is a beam of electromagnetic radiation such as a laser beam. Examples of a suitable source of the laser beam include a Nd:YAG laser, a frequency double 2ω Nd:YAG laser or an Excimer laser.

The thermal energy beam 40 is scanned in two dimensions across the first surface 21 of the wideband gap semiconductor substrate 20 to form the solid state energy conversion device 10. In this example, the first surface 11 of the solid state energy conversion device 10 is coincident with the first surface 21 of the wideband gap semiconductor substrate 20 with the remainder of the solid state energy conversion device 10 including the second surface 12 and the peripheral surface 13 being embedded within the wideband gap semiconductor substrate 20.

The thermal energy beam 40 impinges on the wide-bandgap semiconductor substrate 20 to create the solid state energy conversion device 10 within the wide-bandgap semiconductor substrate 20. In this example, the solid state energy conversion device 10 is located on the first side 21 of the wide-bandgap semiconductor substrate 20. The solid state energy conversion device 10 is shown as a portion of the wide-bandgap semiconductor substrate 20 formed by causing relative movement between the wide-bandgap semiconductor substrate 20 and the thermal energy beam 40.

The wide-bandgap semiconductor substrate 20 may be formed as a monolith or a thin film substrate having suitable properties for forming the solid state energy conversion device 10 in the wide-bandgap semiconductor substrate 20. Laser doping can be conducted on opposing surfaces of a substrate, wafer, thin film, thin film deposited on a flexible substrate or in different regions on the same surface.

Table 1 sets the initial properties of a wide-bandgap semiconductor substrate 20 suitable for creating the solid state energy conversion device 10 of the present invention.

TABLE 1

Properties of Parent Substrates for SiC Energy Conversion Device Fabrication

| Parent Substrate | Typical Resistivity (ohm-cm) | Principle Dopant | Typical principle dopant concentration (/cc) | Notes: |
|---|---|---|---|---|
| 6H-SiC n-type | 0.05 | Nitrogen | $10^{16}$ | a) acceptor impurities may be present b) defects can behave as acceptors |
| 6H-SiC p-type | 0.1-0.2 | Aluminum | $10^{17}$-$10^{20}$ | a) Nitrogen (donor) impurities may be present. b) defects can behave as donors |

TABLE 1-continued

Properties of Parent Substrates for SiC Energy Conversion Device Fabrication

| Parent Substrate | Typical Resistivity (ohm-cm) | Principle Dopant | Typical principle dopant concentration (/cc) | Notes: |
|---|---|---|---|---|
| 6H-SiC semi-insulating | $10^6$-$10^{11}$ | Vanadium | <$10^{14}$ | a) Vanadium can behave as a donor or acceptor. b) Vanadium can complex with defects creating local strains, which create local dipoles which behave as electron carriers. c) Nitrogen can be on the order of $10^{16}$/cc |
| 4H-SiC n-type | 0.044 | Nitrogen | $10^{16}$ | a) acceptor impurities may be present b) defects can behave as acceptors |
| 4H-SiC p-type | 0.1-0.2 | Aluminum | $10^{17}$-$10^{20}$ | a) Nitrogen (donor) impurities may be present b) point defects can behave as donors |
| 4H-SiC semi-insulating | $10^9$-$10^{11}$ | Vanadium | <$10^{14}$ | a) Vanadium can behave as a donor or acceptor; b) Vanadium can complex with defects creating local strains, which create local dipoles which behave as electron carriers. c) Nitrogen can be on the order of $10^{16}$/cc |

Wide bandgap semiconductors (WBGSs) have been laser doped with both n- and p-type dopants. Specific dopant types and substrates include nitrogen and cobalt in diamond-like carbon; magnesium in GaN; and aluminum, nitrogen, chromium, boron, gallium, europium, erbium, selenium, oxygen and thulium in silicon carbide from metal-organic and powder precursors.

Laser doping achieves higher dopant concentration than by conventional ion implantation doping. Nitrogen dopant concentration is increased one to three orders of magnitude while aluminum doping is increased from one to four orders of magnitude compared to ion implantation without creating lattice defects. Laser doping depths can be 200-300 nm up to 4 microns or greater. Laser doping enables the doping of atoms, from preferably a metal-organic precursor, that have a valence greater than the positive valence atom in the parent substrate. These unconventional dopants contribute multiple holes per atom creating more efficient radiative states in indirect wide bandgap semiconductors.

For n-type doping, the sample was placed in nitrogen atmosphere at pressure of 30 psi and laser-doped regions were formed on the sample surface by moving the chamber with a stepper motor-controlled translation stage. The height of the chamber was controlled manually through an intermediate stage to obtain different laser spot sizes on the SiC substrate. In case of gallium phosphide (GaP), nitrogen acts as an isoelectronic defect rather than a n-type dopant. For p-type doping, TMA (trimethylaluminum, (CH3)3Al), Bis (ethyl benzene)-chromium and boron were used. TMA was heated in a bubbler source immersed in a water bath maintained at 70° C. until it evaporated and then a carrier gas, methane, was passed through the bubbler to transport the TMA vapor to the laser doping chamber. Similarly for chromium doping, Bis (ethyl benzene)-chromium was heated in a bubbler source immersed in a water bath maintained at 100° C. until it evaporated and then a carrier gas, argon, was passed through the bubbler to transport the ethyl benzene chromium vapor to the laser doping chamber. These dopant gas species decompose at the laser-heated substrate surface producing Al and Cr atoms, which subsequently diffuse into the substrate.

A more detailed discussion follows on the importance doping with atoms that have a sufficient valence to create multi-hole acceptors. Chromium (6+), which has a valence of two greater than the silicon (4+) component of silicon carbide, is used as a dopant example to create efficient radiative states. Normally dopant atoms are from the adjacent groups in the periodic table that are on either side of the atom of an atomic constituent of the parent wide bandgap semiconductor. For example Si is in group IV and elements such as Al (p-type dopant) and P (n-type dopant) are in groups III and V respectively. The transition metal Cr has been doped into SiC, which does not follow this conventional approach. Additionally Cr acts as an acceptor creating two holes per Cr atom (a multi-hole acceptor); higher Cr concentrations greatly increase the acceptor population as confirmed by deep level transient spectroscopy (DLTS). DLTS spectra of a 4H—SiC (n-type-N) wafer substrate laser doped with chromium shows minority carrier trap peaks due to acceptor (holes) states in a chromium-doped 4H—SiC (n-type) wafer, which confirms that chromium is a p-type dopant. The DLTS technique is a powerful tool for determining the defect properties such as defect energy level, capture cross-section, and trap density. A modified DLTS that combines junction spectroscopy with illumination in a double pulse approach can be used to identify the minority carrier traps acting as recombination centers.

The technique is based on the transient capacitance change associated with the thermal emission of charge carriers from a trap level to thermal equilibrium after an initial non-equilibrium condition in the space-charge region of a Schottky barrier or a p-n junction diode. The polarity of the DLTS peak depends on the capacitance change after trapping the minority or majority carriers. In general, a minority carrier trap produces a positive DLTS peak, while a majority carrier trap yields a negative DLTS peak. [D. V. Lang, Fast capacitance transient apparatus: Application to ZnO and O centers in GaP p-n junctions, J. Appl. Phys. 45 (1974) 3014-3022.

The active state of Cr was confirmed by Hall effect measurements using a Cr-doped n-type (nitrogen-doped) 4H—SiC sample. This sample was prepared using the same laser doping parameters as used for laser doping Cr into the p-type 4H—SiC wafer. The Hall measurement identified the Cr-doped region as p-type with a carrier concentration of $1.942 \times 10^{19}$ cm$^{-3}$ which is almost twice the average dopant concentration (~$10^{19}$ cm$^{-3}$). The average dopant concentration is based on the Secondary Ion Mass Spectroscopy (SIMS) data for n-type 4H—SiC with a concentration of $2 \times 10^{19}$ cm$^{-3}$ at the wafer surface and $10^{17}$ cm$^{-3}$ at a depth of 500 nm. This data confirms Cr as a double acceptor and also indicate that the laser doping technique activated all the dopant atoms without the need of any additional annealing step.

Conversely, SiC can be doped with fewer Cr atoms than Al atoms to achieve the same hole concentration. Fewer Cr atoms in the SiC lattice is expected to produce less strain and defects in the material than in the case of higher concentrations of Al.

Similarly, multi-electron donors can be laser doped into SiC. Europium having a +2 valence, derived from a Europium Tetramethyl, 3,5 heptanedionate precursor vapor decomposes upon laser heating and is diffused into SiC substrate using the process described for Cr laser doping. Selenium derived from a diethylselenium precursor also behaves as a multi-electron donor.

Laser doping can convert indirect bandgap semiconductors to direct bandgap semiconductors by intentionally inducing strain to alter electron momentum states. An indirect bandgap semiconductor has a conduction band bottom that does not occur at momentum (k)=0 while the top of the valence band does occur at k=0. Therefore energy released during electron recombination with a hole is converted primarily into a phonon (additional momentum), a quasi-particle which is a quantized sound wave; e.g. Si, GaP, SiC. A direct bandgap semiconductor has a conduction band bottom and valence band top occurring at the momentum k=0. Therefore energy released during band-to-band electron recombination with a hole is converted primarily into photon radiation (radiant recombination) exhibiting a wavelength determined by the energy gap; e.g. GaAs, InP, GaN; no extra momentum is required. Direct bandgap semiconductors are sometimes referred to as "optically active" and indirect as "optically inactive". Laser doping where the dopant has a valence greater than the highest valence atom of the comprising the parent wide bandgap semiconductor can transform the SiC indirect wide bandgap semiconductor into a direct bandgap semiconductor; dopants with a valence 2 or greater than the highest valence atom comprising the parent wide bandgap semiconductor are preferred. This doping induces strain which alters the momentum state of the electrons and facilitates the transfer of electron-hole recombination between the conduction and valence bands with no additional momentum.

Conversely a solid state photovoltaic device with p and n regions can produce electric current when light or electromagnetic radiation is irradiated on the solid state photovoltaic device.

The laser doping technology of the present invention can be used to create energy conversion devices in many semiconductor structures such as diodes, transistors and other electron components in monolithic or thin film geometries.

FIG. 3A is a side sectional view of a first example of a solid state energy conversion device 10A formed in accordance with the present invention to provide a solid state light emitting device. In this example, the substrate 20A has a first and a second side 21A and 22A and a peripheral edge 23A. A laser doped region 51A is formed on the first side 21A of the substrate 20A. A first and a second Ohmic contact 61A and 62A are electrically connected to the first and second side 21A and 22A of the substrate 20A. The solid state light emitting device 10A produces electromagnetic radiation when an electric current is injected between the first and second Ohmic contacts 61N and 62N as indicated by the battery 71A.

Preferably, the first and second electrodes 61A and 62A are formed by the thermal conversion of the wide-bandgap semiconductor substrate 20A. The conversion of the portions of the wide-bandgap semiconductor substrate 20A to provide the first and second electrodes 61A and 62A is set forth in my U.S. Pat. No. 5,145,741; U.S. Pat. No. 5,391,841; U.S. Pat. No. 5,793,042; U.S. Pat. No. 5,837,607; U.S. Pat. No. 6,025, 609; U.S. Pat. No. 6,054,375; U.S. Pat. No. 6,271,576 and U.S. Pat. No. 6,670,693.

FIG. 3B is a side sectional view of a second example of a solid state energy conversion device formed in accordance with the present invention to provide a solid state light emitting device 10B. In this example, the substrate 20B has a first and a second side 21B and 22B and a peripheral edge 23B. Laser doped regions 51B and 52B are formed on the first side 21B of the substrate 20A. A first and a second Ohmic contact 61B and 62B are electrically connected to the laser doped regions 51B and 52B. The solid state light emitting device 10B produces electromagnetic radiation when an electric current is injected between the first and second Ohmic contacts 61B and 62B as indicated by the battery 71B.

FIG. 3C is a side sectional view of a third example of a solid state energy conversion device formed in accordance with the present invention to provide a solid state light emitting device 10C. In this example, the substrate 20C has a first and a second side 21C and 22C and a peripheral edge 23C. Laser doped regions 51C and 52C are formed in layers on the first side 21C of the substrate 20A. A first and a second Ohmic contact 61A and 62A are electrically connected to the first and second side 21C and 22C of the substrate 20C. The solid state light emitting device 10C produces electromagnetic radiation when an electric current is injected between the first and second Ohmic contacts 61C and 62C as indicated by the battery 71C.

FIG. 4A is a side sectional view of a fourth example of a solid state energy conversion device formed in accordance with the present invention to provide a solid state photovoltaic device 10D. In this example, the substrate 20D has a first and a second side 21D and 22D and a peripheral edge 23D. A laser doped region 51D is formed on the first side 21D of the substrate 20D. A first and a second Ohmic contact 61D and 62D are electrically connected to the first and second side 21D and 22D of the substrate 20D. The solid state photovoltaic device 10D produces an electric current between the first and second Ohmic contacts 61D and 62D upon receiving electromagnetic radiation as indicated by the ammeter 72D.

FIG. 4B is a side sectional view of a fifth example of a solid state energy conversion device formed in accordance with the present invention to provide a solid state photovoltaic device 10E. In this example, the substrate 20E has a first and a second side 21E and 22E and a peripheral edge 23E. Laser doped regions 51E and 52E are formed in the first and second sides 21E and 22E of the substrate 20E. A first and a second Ohmic contact 61E and 62E are electrically connected to the first and second side 21E and 22E of the substrate 20E. The solid state photovoltaic device 10E produces an electric current between the first and second Ohmic contacts 61E and 62E upon receiving electromagnetic radiation as indicated by the ammeter 72E.

FIG. 4C is a side sectional view of a sixth example of a solid state energy conversion device formed in accordance with the present invention to provide a solid state photovoltaic device 10F. In this example, the substrate 20F has a first and a second side 21F and 22F and a peripheral edge 23F. Laser doped regions 51F and 52F are formed in layers on the first side 21F of the substrate 20F. A first and a second Ohmic contact 61F and 62F are electrically connected to the first and second side 21F and 22F of the substrate 20F. The solid state photovoltaic device 10F produces an electric current between the first and second Ohmic contacts 61F and 62F upon receiving electromagnetic radiation as indicated by the ammeter 72F.

Figure 5:
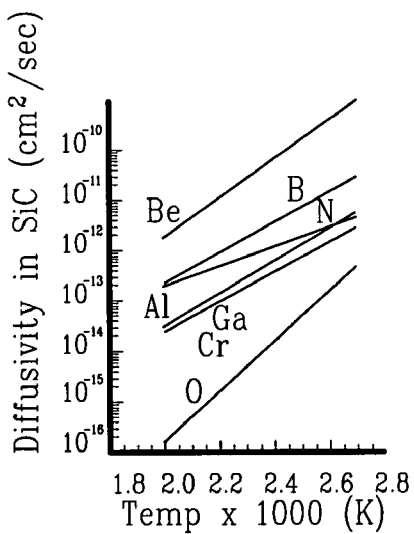
FIG. 5 is a graph of conventional dopant diffusivity in SiC as a function of reciprocal temperature for conventional processing.

FIG. 5 is a graph of diffusivity of various conventional dopants into SiC using conventional doping processes (e.g., thermal, ion implantation). Conventional doping processes also limit the choice of dopants. For example, nitrogen diffusivity in silicon carbide SiC is $5\times10^{-12}$ $cm^2$/second at a temperature greater than 2500° C. and aluminum diffusivity in silicon carbide SiC is $3\times10^{-14}$ to $6\times10^{-12}$ $cm^2$/second at a temperature greater than 1200° C. using conventional doping techniques. The process of laser doping of the present invention increases nitrogen diffusivity in silicon carbide SiC between $2\times10^{-5}$ and $9\times10^{-6}$ cm²/sec and increases aluminum diffusivity in silicon carbide SiC between $1\times10^{-5}$ and $1\times10^{-6}$ cm²/sec. The process of laser doping of the present invention enables the use of new species of dopants including chromium (Cr), europium (Eu) and selenium (Se) with wide bandgap substrates.

Laser doping, a non-equilibrium process, enables achievement of very high dopant concentrations at the surface, which can exceed the solubility limit. Z. Tian, N. R. Quick and A. Kar, Acta Materialia, 54, 4273, (2006) have shown that laser doping enhances the diffusion coefficient of aluminum and nitrogen in SiC by about six orders of magnitude when compared to conventional doping techniques. It readily facilitates the formation of dopant concentration gradients along the depth of the wafer, i.e., the concentration decreases gradually along the depth. A linearly graded junction can be obtained that further facilitates the effective electron-hole recombination within the depletion region for light emitting applications, E. Fred Schubert, "Light Emitting Diodes", Cambridge University Press, (2003).

Figure 6:
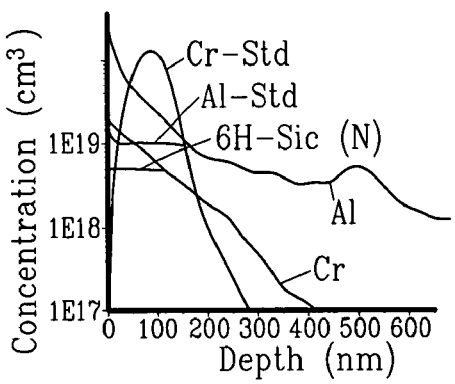
FIG. 6 is a graph of concentration of the dopants Cr, N and Al as a function of depth within a 6H—SiC silicon carbide wide bandgap substrate.

A PHI Adept 1010 Dynamic Secondary Ion Mass Spectroscopy system (SIMS) was used to determine the dopant concentration and its variation along the depth for the p and n regions of the device. An aluminum-doped SiC standard ($1\times10^{19}$ cm-3), Cr-implanted SiC standard ($1\times10^{20}$ cm$^{-3}$), N-doped SiC standard ($5\times10^{-3}$), as received 4H—SiC (p-type) and an as-received 6H—SiC (n-type) ($5\times10^{18}$ cm$^{-3}$) were also analyzed for reference and background concentrations FIG. 6A is a graph of concentration of the dopants Cr, N and Al as a function of depth within a 6H—SiC silicon carbide wide bandgap substrate 20. In case of a 6H—SiC silicon carbide wide bandgap substrate 20, a very high concentration of about $2\times10^{20}$ cm$^{-3}$ was measured for Al at the surface decreasing gradually to $1\times10^{18}$ cm$^{-3}$ to a depth of 700 nm, while a concentration of $1\times10^{19}$ cm$^{-3}$ was measured for Cr at the surface decreasing gradually to the background concentration of $1\times10^{17}$ cm$^{-3}$ at a depth of 420 nm. The penetration depth of Al is much larger than that of Cr due to the size effect of these elements. Aluminum is much smaller than Cr and slightly smaller than Si and it can penetrate SiC easily and occupy the available Si vacancies. For Cr occupancy of Si vacancies the penetration is accompanied by lattice strain. Additionally, the solid solubility limits in SiC for Al ($2\times10^{21}$ cm$^{-3}$) is much higher than Cr ($3\times10^{17}$ cm$^{-3}$) G. L. Harris, "Properties of silicon carbide", IEE Inspec publication, emis data review series 13, (1995).

bide wide bandgap substrate 20. In case of a 4H—SiC silicon carbide wide bandgap substrate 20, a very high concentration of approximately $1\times10^{21}$ cm$^{-3}$ was obtained for N at the surface decreasing gradually to $3\times10^{17}$ cm$^{-3}$ to a depth of 8.5 μm, while a concentration of $1.5\times10^{19}$ cm-3 was obtained for Cr at the surface decreasing gradually to the background concentration of $1\times10^{15}$ cm$^{-3}$ at a depth of 80 nm. The penetration depth of N is much larger than that of Cr, which results from the atomic radius difference. The smaller nitrogen atom can penetrate SiC easily and occupy the available C or Si vacancies. Also, the solid solubility limits in SiC for N ($6\times10^{20}$ cm$^{-3}$) is much higher than Cr ($3\times10^{17}$ cm$^{-3}$). These dopant concentration levels and their penetration depths can be altered easily by modifying the doping parameters. Laser doping thus provides this advantage and is compatible with both conventional (e.g., Al, N) and unconventional (e.g., Cr) dopants.

Figure 7:
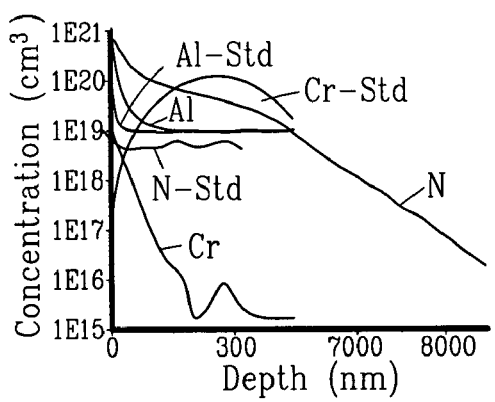
FIG. 7 is a graph of concentration of the dopants Cr, N and Al as a function of depth within a 4H—SiC silicon carbide wide bandgap substrate.

FIG. 7 is a graph of operating temperature as a function of bandgap for various types of p-n junctions semiconductors. Since crystalline SiC is chemically inert and has good thermo-mechanical properties at high temperatures, photovoltaic device made of p-n regions in SiC can be located at the walls of combustion chambers, particularly in power plants, to directly convert radiative energy, e.g., heat, into electrical energy. Burning fuels and the resultant flames produce electromagnetic radiation in the ultraviolet (UV), visible and infrared regions of the spectrum. The combustion chamber is modified to contain stacks of SiC photovoltaic cells so that each stack can absorb the radiation of a selected wavelength range to directly produce electricity.

Light Emitting Device

Figure 8A:
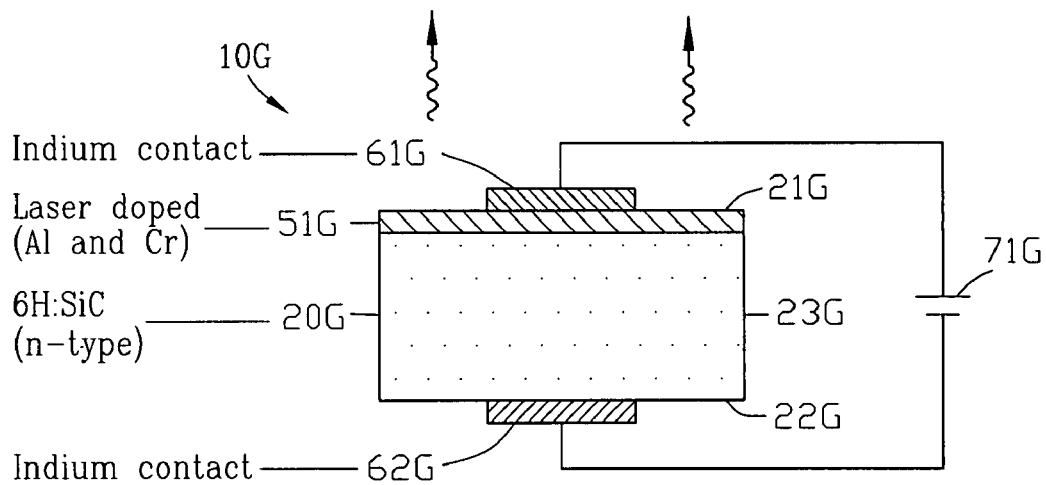
FIG. 8A is a side sectional view of a first example of a white light solid state emitting device fabricated on 6H:SiC (n-type) substrate by doping with aluminum and chromium.

FIG. 8A is a side sectional view of a first example of a light emitting device 10G fabricated on 6H:SiC (n-type) substrate 20G by doping with aluminum and chromium. The substrate 20G defines a first and a second side 21G and 22G and a peripheral edge 23G. A first and a second Ohmic contact 61G and 62G are electrically connected to the first and second side 21G and 22G of the substrate 20G.

Table 2 sets forth the parameters for the fabrication of the light emitting device 10G of FIG. 8A. It should be appreciated by those skilled in the art that Table 2 is a specific example and that numerous other parameters may be used to fabricate light emitting devices having different characteristics.

TABLE 2

| Sample | Color Contribution in LEDs | Dopant | Power (W) | Pulse repetition rate (KHz) | Focal Length (mm) | Spot size (μm) | # of passes | Scanning speed (mm/sec) | Dopant medium |
|---|---|---|---|---|---|---|---|---|---|
| 6H:SiC n-type | White, Green | Cr | 11.6 | 4 | 150 | 65 | 1 | 0.8 | Bis (ethyl benzene)-chromium, argon 30 psi |
|  | White, Blue | Al | 11.5-12 | 5 | 150 | 65 | 2 | 0.5 | Trimethyl aluminum, Methane 30 psi |

The concentration of Cr at the surface is about two orders of magnitude higher than the solid solubility limit, while for aluminum it is very close to the solubility limit.

Figure 8B:
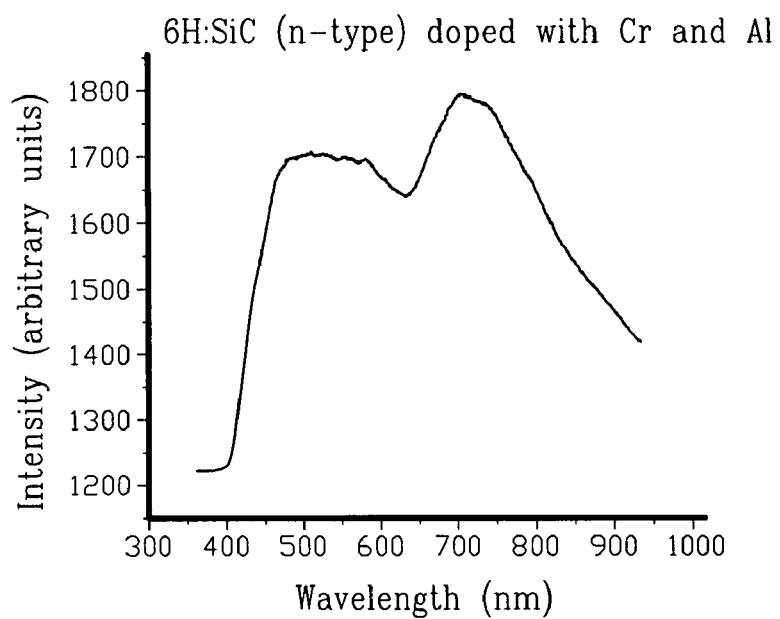
FIG. 8B is a graph of light intensity as a function of wavelength for the solid state light emitting device of FIG. 8A.

FIG. 6B is a graph of concentration of the dopants Cr, N and Al as a function of depth within a 4H—SiC silicon car- FIG. 8B is a graph of light intensity as a function of wavelength for the light emitting device 10G of FIG. 8A. The graph of FIG. 8B illustrates the distribution of light intensity, in arbitrary units, as a function of frequency for the light emitting device 10G of FIG. 8A. The sum of the distribution of light intensity of the light emitting device 10G results in a white light. The white light emission is created by laser doping with aluminum and chromium. A broad EL spectrum starting from 400 nm (band gap of 6H—SiC) to 900 nm covering the entire visible spectrum is observed. The red luminescence results form a nitrogen excitation and other defect states luminescence. The green and blue luminescence result from donor-acceptor pair recombination between N—Cr and N—Al, respectively. This red-green-blue (RGB) combination produces an observed broadband white light.

Current LED technology has shortcomings with matching color rendering index and color temperature of sunlight. The color rendering index (CRI) (sometimes called Color Rendition Index), is a measure of the ability of a light source to reproduce the colors of various objects being lit by the source. It is a method devised by the International Commission on Illumination (CIE). The human eye has receptors for short (S), middle (M), and long (L) wavelengths, also known as blue, green, and red receptors. That means that one, in principle, needs three parameters to describe a color sensation. A specific method for associating three numbers (or tristimulus values) with each color is called a color space, of which the CIE XYZ color space is one of many such spaces. However, the CIE XYZ color space is special, because it is based on direct measurements of the human eye, and serves as the basis from which many other color spaces are defined.

In the CIE XYZ color space, the tristimulus values are not the S, M, and L stimuli of the human eye, but rather a set of tristimulus values called X, Y, and Z, which are also roughly red, green and blue, respectively. Two light sources may be made up of different mixtures of various colors, and yet have the same color (metamerism). If two light sources have the same apparent color, then they will have the same tristimulus values, no matter what different mixtures of light were used to produce them.

"Visible light" is commonly described by its color temperature. A traditional incandescent light source's color temperature is determined by comparing its hue with a theoretical, heated black-body radiator. An incandescent light is very close to being a black-body radiator. However, many other light sources, such as fluorescent lamps, do not emit radiation in the form of a black-body curve, and are assigned what is known as a correlated color temperature (CCT), which is the color temperature of a black body which most closely matches the lamp's perceived color. Because such an approximation is not required for incandescent light, the CCT for an incandescent light is simply its unadjusted kelvin value, derived from the comparison to a heated black-body radiator. Bright midday sun is 5200 K and average daylight, and electronic flash, is 5500K.

The color rendering index of the white light emitting diode as per the 1931 CIE chromaticity at 2 degree on 6H—SiC (n-type-N) wafer substrate laser doped with aluminum and chromium has the following tristimulus values; X=0.3362, Y=0.3424 and Z=0.3214 which confirms white color space. These values render a color temperature of 5338 K which is very close to the incandescent lamp (or black body) and lies between bright midday sun (5200 K) and average daylight (5500 K)

Figure 9A:
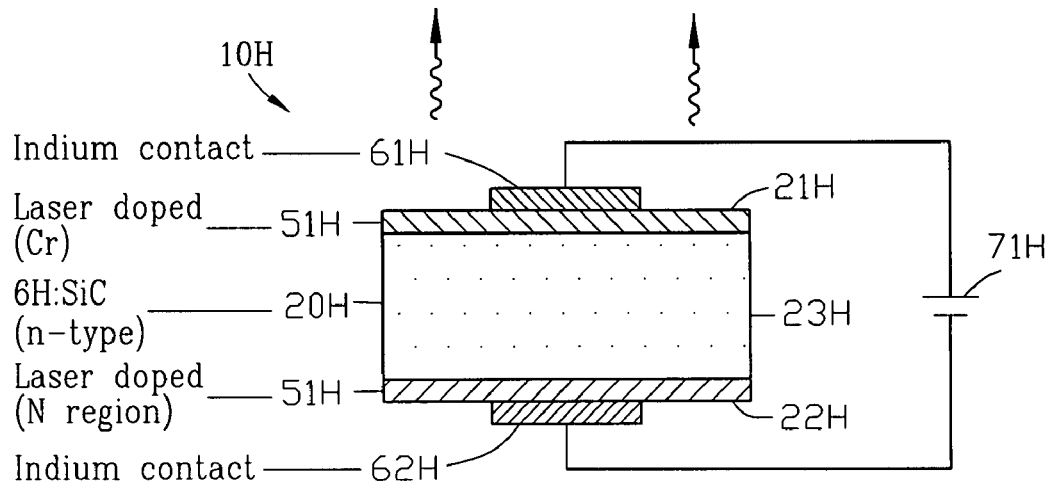
FIG. 9A is a side sectional view of a second example of a white light solid state light emitting device fabricated on 4H:SiC (p-type) substrate by doping with nitrogen and chromium.

FIG. 9A is a side sectional view of a first example of a light emitting device 10H fabricated on 4H:SiC (p-type) substrate 20H by doping with a with nitrogen and chromium. The substrate 20H defines a first and a second side 21H and 22H and a peripheral edge 23H. A first and a second Ohmic contact 61H and 62H are electrically connected to the first and second side 21H and 22H of the substrate 20H.

Table 3 sets forth the parameters for the fabrication of the light emitting device 10H of FIG. 9A. It should be appreciated by those skilled in the art that Table 3 is a specific example and that numerous other parameters may be used to fabricate light emitting devices having different characteristics.

TABLE 3

| Sample | Color Contribution in LEDs | Dopant | Power (W) | Pulse repetition rate (KHz) | Focal Length (mm) | Spot size (μm) | # of passes | Scanning speed (mm/sec) | Dopant medium |
|---|---|---|---|---|---|---|---|---|---|
| 4H:SiC p-type | White | N | 12 | 5 | 150 | 80 | 3 | 0.8 | Ultra high pure nitrogen 30 psi |
| | White, Orange-Red | Cr | 12.5-13 | 5 | 150 | 65 | 1 | 0.5 | Bis (ethyl benzene)-chromium, argon 30 psi |

Figure 9B:
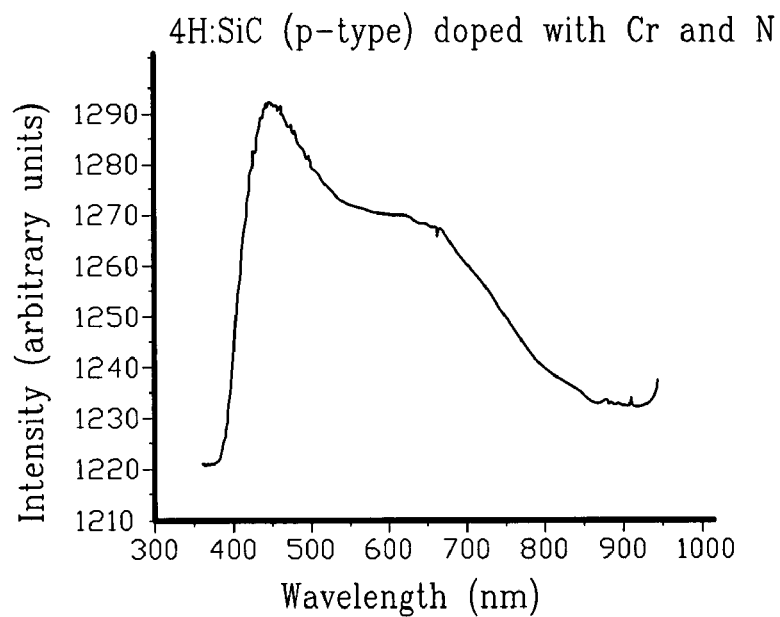
FIG. 9B is a graph of light intensity as a function of wavelength for the solid state light emitting device of FIG. 9A.

FIG. 9B is a graph of light intensity as a function of wavelength for the light emitting device 10H of FIG. 9A. The graph of FIG. 9B illustrates the distribution of light intensity as a function of frequency for the light emitting device 10H of FIG. 9A. The sum of the distribution of light intensity of the light emitting device 10H results in a white light. White light emission is created by laser doping with both nitrogen and chromium. A broad spectrum extending from 380 nm (band gap of 4H—SiC) to 850 nm is observed. Green and blue wavelengths are observed due to the occurrence of radiative recombination transitions between donor-acceptors pairs of N—Cr and N—Al respectively, while prominent violet wavelength was observed due to nitrogen-valence band level transitions. The red luminescence was mainly due to nitrogen exciton and other defect levels. This red-green-blue (RGB) combination produces an observed broadband white light. The color rendering index for this white light emitting diode as per the 1931 CIE chromaticity at 2 degree has the following tristimulus values; X=0.3322, Y=0.3320 and Z=0.3358. The color temperature is 5510 K which is very close to average daylight (5500 K)

Figure 10A:
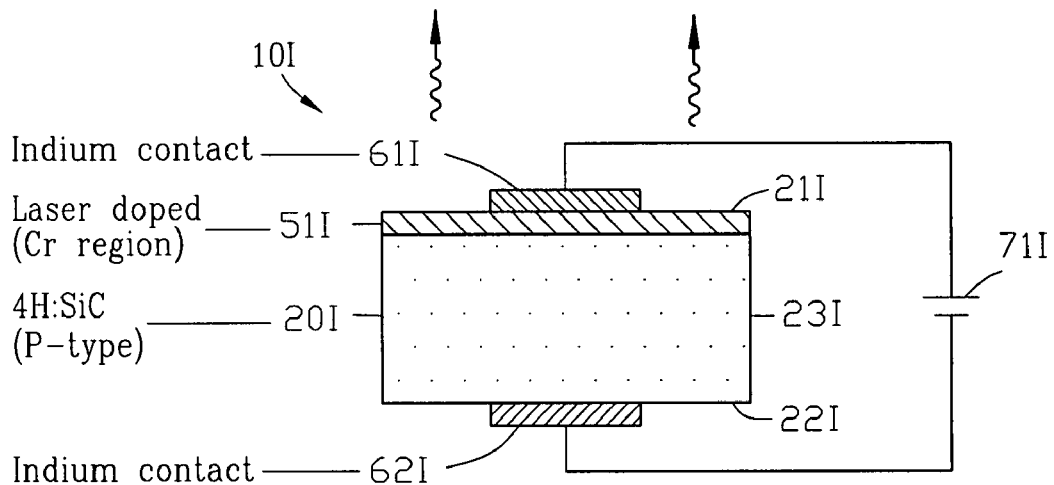
FIG. 10A is a side sectional view of a third example of an orange-red solid state light emitting device fabricated on 4H:SiC (p-type) substrate by doping with chromium.

FIG. 10A is a side sectional view of a first example of a light emitting device 10I fabricated on 4H:SiC (p-type) substrate 20I by doping with chromium. The substrate 20I defines a first and a second side 21I and 22I and a peripheral edge 23I. A first and a second Ohmic contact 61I and 62I are electrically connected to the first and second side 21I and 22I of the substrate 20I.

Table 4 sets forth the parameters for the fabrication of the light emitting device 10I of FIG. 7A. It should be appreciated by those skilled in the art that Table 4 is a specific example and that numerous other parameters may be used to fabricate light emitting devices having different characteristics.

TABLE 4

| Sample | Color Contribution in LEDs | Dopant | Power (W) | Pulse repetition rate (KHz) | Focal Length (mm) | Spot size (μm) | # of passes | Scanning speed (mm/sec) | Dopant medium |
|---|---|---|---|---|---|---|---|---|---|
| 4H:SiC p-type | White, Orange-Red | Cr | 12.5-13 | 5 | 150 | 65 | 1 | 0.5 | Bis (ethyl benzene)-chromium, argon 30 psi |

Figure 10B:
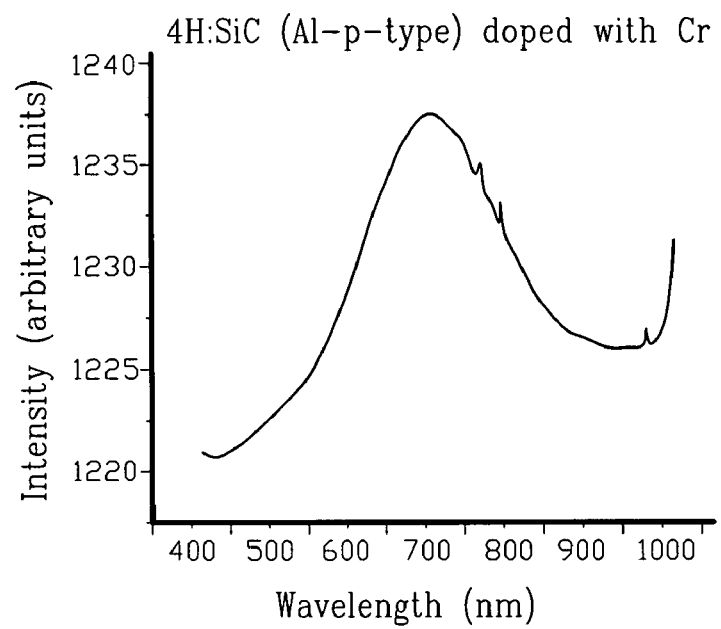
FIG. 10B is a graph of light intensity as a function of wavelength for the solid state light emitting device of FIG. 10A.

FIG. 10B is a graph of light intensity as a function of wavelength for the light emitting device 10I of FIG. 10A. The graph of FIG. 10B illustrates the distribution of light intensity as a function of frequency for the light emitting device 10I of FIG. 10A. The sum of the distribution of light intensity of the light emitting device 10I results in an orange-red light.

Figure 11A:
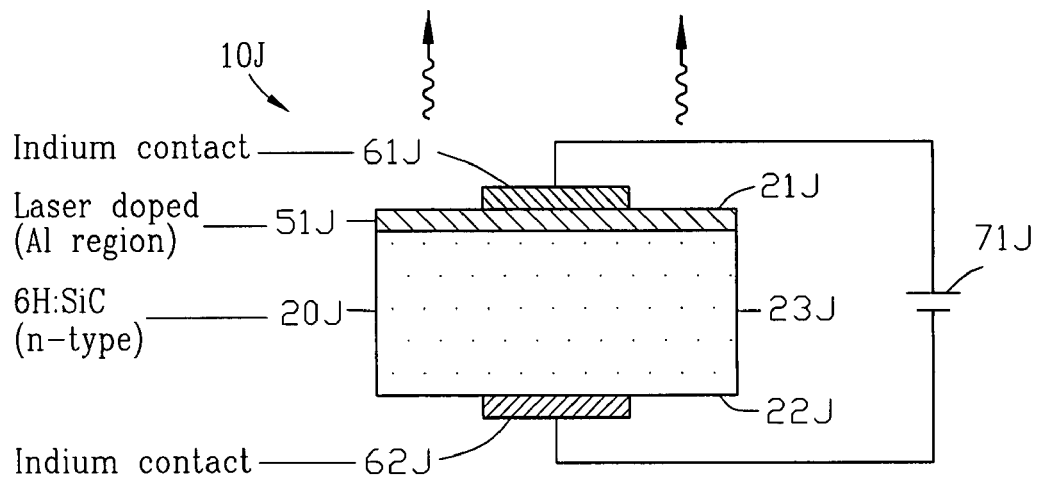
FIG. 11A is a side sectional view of a fourth example of a green light solid state light emitting device fabricated on 6H:SiC (n-type) substrate by doping with chromium.

FIG. 11A is a side sectional view of a first example of a light emitting device 10J fabricated on 6H:SiC (n-type) substrate 20J by doping with chromium. The substrate 20J defines a first and a second side 21J and 22J and a peripheral edge 23J. A first and a second Ohmic contacts 61J and 62J are electrically connected to the first and second side 21J and 22J of the substrate 20J.

Table 5 sets forth the parameters for the fabrication of the light emitting device 10J of FIG. 11A. It should be appreciated by those skilled in the art that Table 5 is a specific example and that numerous other parameters may be used to fabricate light emitting devices having different characteristics.

Figure 11B:
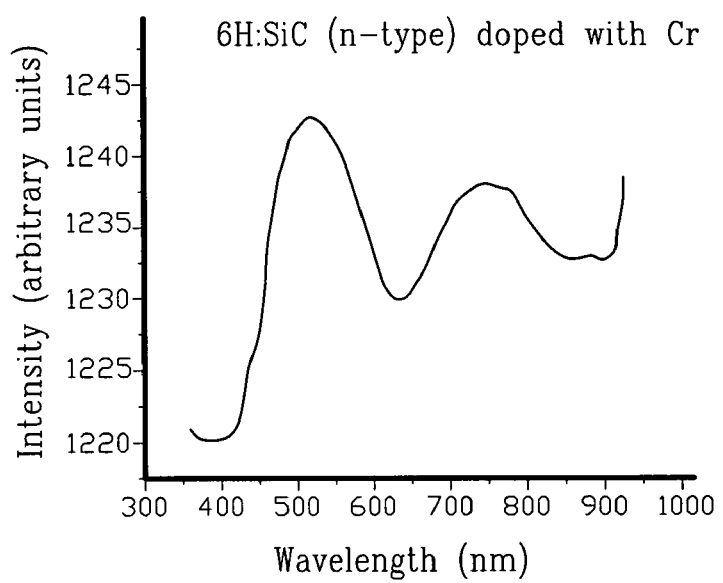
FIG. 11B is a graph of light intensity as a function of wavelength for the solid state light emitting device of FIG. 11A.

FIG. 11B is a graph of light intensity as a function of wavelength for the light emitting device 10J of FIG. 11A. The graph of FIG. 11B illustrates the distribution of light intensity as a function of frequency for the light emitting device 10J of FIG. 11A. The sum of the distribution of light intensity of the light emitting device 10J results in a green light.

Figure 12A:
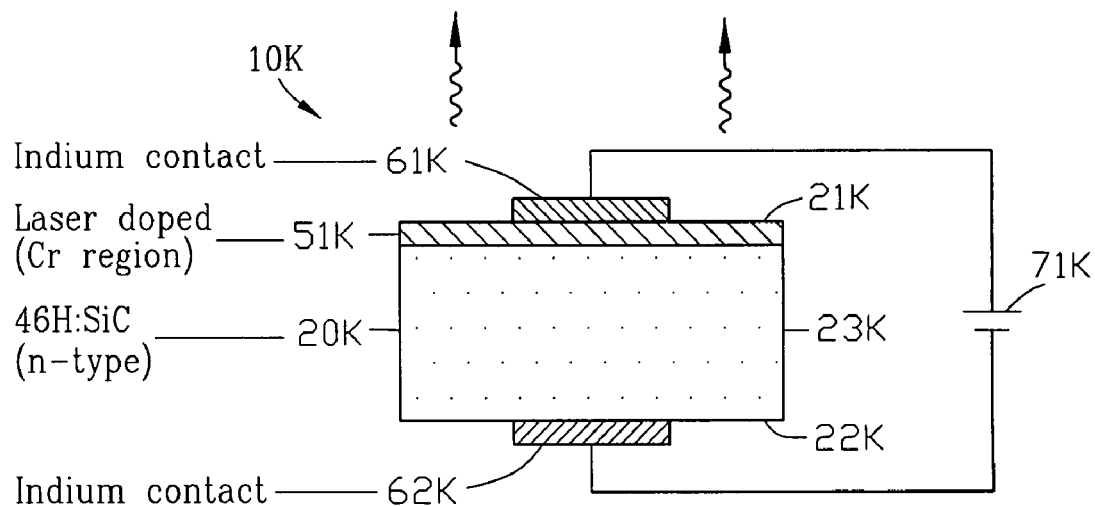
FIG. 12A is a side sectional view of a fifth example of a red light solid state light emitting device of fabricated on 4H:SiC (n-type) substrate by doping with chromium.

FIG. 12A is a side sectional view of a first example of a light emitting device 10K fabricated on 4H:SiC (n-type) substrate 20K by doping with chromium. The substrate 20K defines a first and a second side 21K and 22K and a peripheral edge 23K. A first and a second Ohmic contact 61K and 62K are electrically connected to the first and second side 21K and 22K of the substrate 20K.

Table 6 sets forth the parameters for the fabrication of the light emitting device 10K of FIG. 12A. It should be appreciated by those skilled in the art that Table 6 is a specific example and that numerous other parameters may be used to fabricate light emitting devices having different characteristics.

TABLE 5

| Sample | Color Contribution in LEDs | Dopant | Power (W) | Pulse repetition rate (KHz) | Focal Length (mm) | Spot size (μm) | # of passes | Scanning speed (mm/sec) | Dopant medium |
|---|---|---|---|---|---|---|---|---|---|
| 6H:SiC n-type | White, Green | Cr | 11.6 | 4 | 150 | 65 | 1 | 0.8 | Bis (ethyl benzene)-chromium, argon 30 psi |

TABLE 6

| Sample | Color Contribution in LEDs | Dopant | Power (W) | Pulse repetition rate (KHz) | Focal Length (mm) | Spot size (μm) | # of passes | Scanning speed (mm/sec) | Dopant medium |
|---|---|---|---|---|---|---|---|---|---|
| 4H:SiC n-type | White, Red, Green, Voilet | Cr | 12 | 5 | 150 | 65 | 2 | 0.5 | Bis (ethyl benzene)-chromium, argon 30 psi |

Figure 12B:
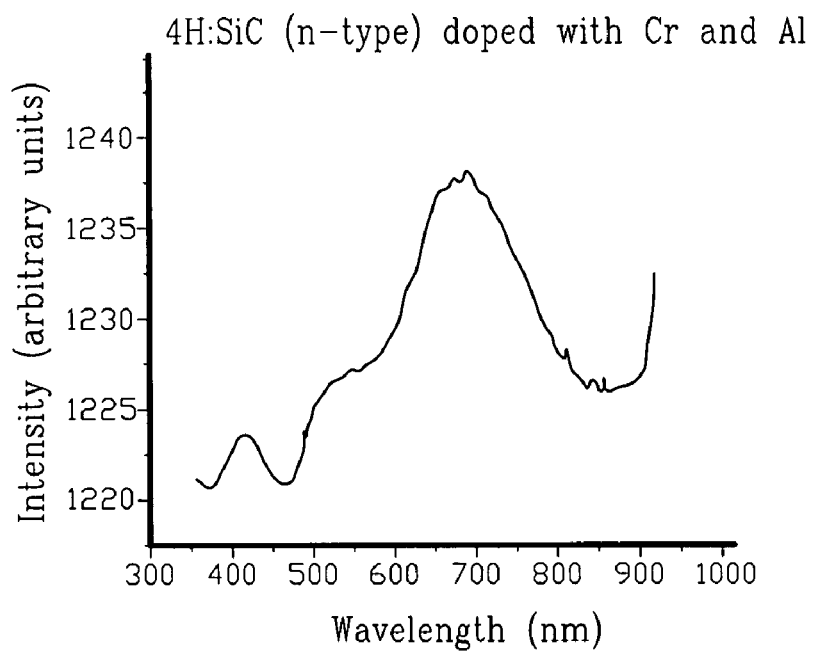
FIG. 12B is a graph of light intensity as a function of wavelength for the solid state light emitting device of FIG. 12A.

FIG. 12B is a graph of light intensity as a function of wavelength for the light emitting device 10K of FIG. 12A. The graph of FIG. 12B illustrates the distribution of light intensity as a function of frequency for the light emitting device 10K of FIG. 12A. The sum of the distribution of light intensity of the light emitting device 10K results in a red light.

Figure 13A:
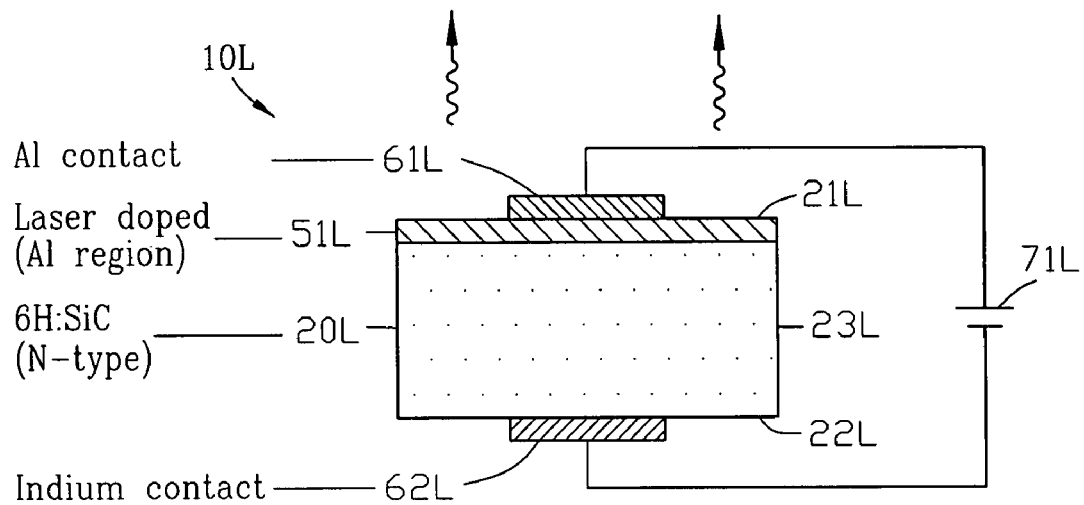
FIG. 13A is a side sectional view of a sixth example of a blue light solid state light emitting device fabricated on 6H:SiC (n-type) substrate by doping with aluminum.

FIG. 13A is a side sectional view of a first example of a light emitting device 10L fabricated on 6H:SiC (n-type) substrate 20L by doping with aluminum. The substrate 20L defines a first and a second side 21L and 22L and a peripheral edge 23L. A first and a second Ohmic contact 61L and 62L are electrically connected to the first and second side 21L and 22L of the substrate 20L.

Table 7 sets forth the parameters for the fabrication of the light emitting device 10L of FIG. 13A. It should be appreciated by those skilled in the art that Table 7 is a specific example and that numerous other parameters may be used to fabricate light emitting devices having different characteristics.

TABLE 7

| Sample | Color Contribution in LEDs | Dopant | Power (W) | Pulse repetition rate (KHz) | Focal Length (mm) | Spot size (μm) | # of passes | Scanning speed (mm/sec) | Dopant medium |
|---|---|---|---|---|---|---|---|---|---|
| 6H:SiC n-type | White, Blue | Al | 11.5-12 | 5 | 150 | 65 | 2 | 0.5 | Trimethyl aluminum, Methane 30 psi |

Figure 13B:
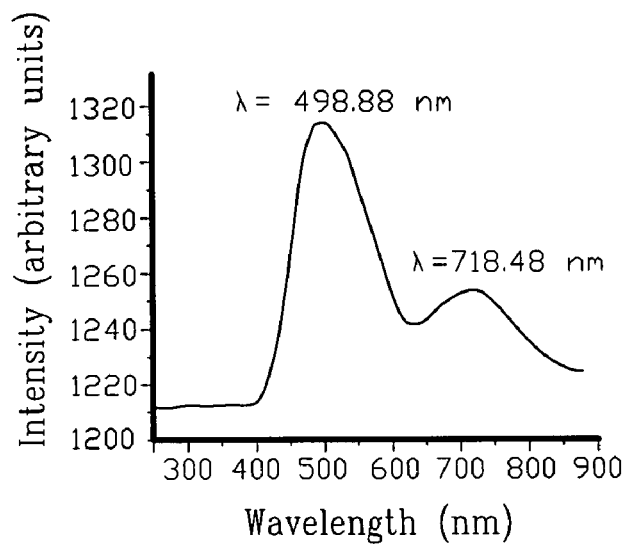
FIG. 13B is a graph of light intensity as a function of wavelength for the solid state light emitting device of FIG. 13A.

FIG. 13B is a graph of light intensity as a function of wavelength for the light emitting device 10L of FIG. 13A. The graph of FIG. 13B illustrates the distribution of light intensity as a function of frequency for the light emitting device 10L of FIG. 13A. The sum of the distribution of light intensity of the light emitting device 10L results in a white light.

Figure 14A:
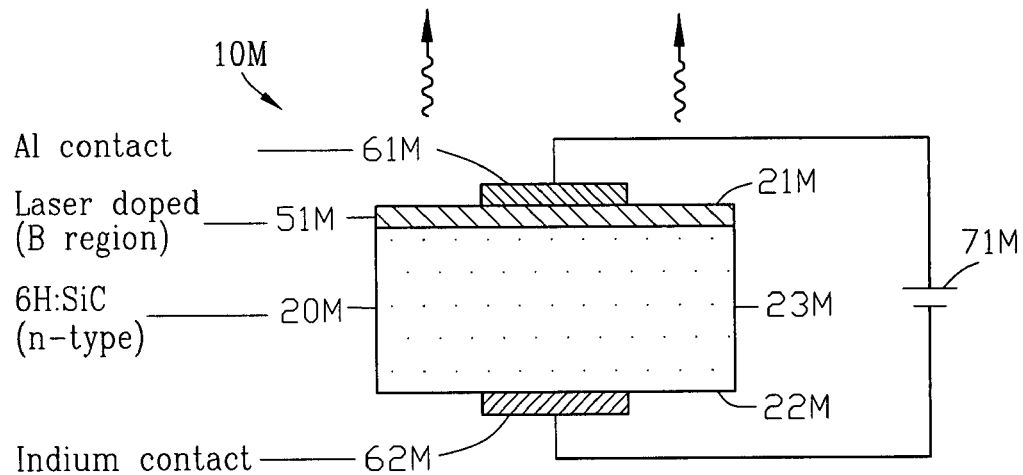
FIG. 14A is a side sectional view of a seventh example of a blue-green solid state light emitting device fabricated on 6H:SiC (n-type) substrate by doping with boron.

FIG. 14A is a side sectional view of a first example of a light emitting device 10M fabricated on 6H:SiC (n-type) substrate 20M by doping with boron. The substrate 20M defines a first and a second side 21M and 22M and a peripheral edge 2M. A first and a second Ohmic contact 61M and 62M are electrically connected to the first and second side 21M and 22M of the substrate 20M.

Table 8 sets forth the parameters for the fabrication of the light emitting device 10M of FIG. 11A. It should be appreciated by those skilled in the art that Table 8 is specific example and that numerous other parameters may be used to fabricate light emitting devices having different characteristics.

TABLE 8

| Sample | Color Contribution in LEDs | Dopant | Power (W) | Pulse repetition rate (KHz) | Focal Length (mm) | Spot size (μm) | # of passes | Scanning speed (mm/sec) | Dopant medium |
|---|---|---|---|---|---|---|---|---|---|
| 6H:SiC n-type | Blue-Green | B | 10.5 | CW | 150 | 100 | 1 | 0.8 | Boron Powder, argon 30 psi |
| | Blue-Green | B | 12 | 5 | 150 | 80 | 2 | 0.8 | Drive in, Argon 30 psi |

Figure 14B:
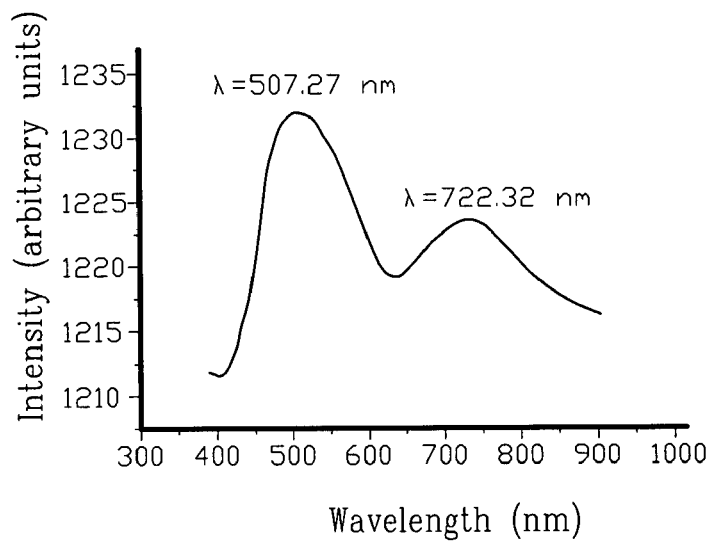
FIG. 14B is a graph of light intensity as a function of wavelength for the solid state light emitting device of FIG. 14A.

FIG. 14B is a graph of light intensity as a function of wavelength for the light emitting device 10M of FIG. 14A. The graph of FIG. 14B illustrates the distribution of light intensity as a function of frequency for the light emitting device 10M of FIG. 14A. The sum of the distribution of light intensity of the light emitting device 10M results in a blue-green light.

Photovoltaic Device

Figure 15:
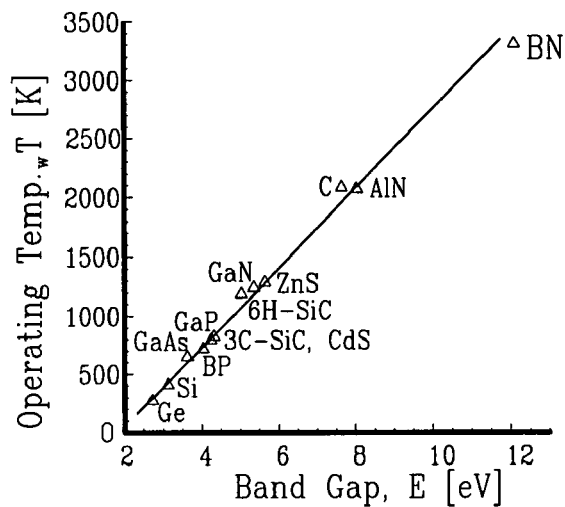
FIG. 15 is a graph of operational temperature as a function of band gap for various solid sate devices.

FIG. 15 is a graph of is a graph of operational temperature as a function of band gap for various solid sate devices. Silicon carbide devices can operate at temperatures exceeding 650° C. [D. K. Sengupta, N. R. Quick and A. Kar, Journal of Laser Applications, pp. 21-26 (2001).] which makes the material attractive as a thermoelectric device [P. M. Martin, "Thin film technology: thermoelectric Energy Conversion 2: Thin film materials", Vacuum Technology & Coating, pg. 8-13, (2007) and Y. Aoki et. al., "Study of Silicon Carbide Thermoelectric Materials made by SPS for MHD Power System", 34th AIAA Plasma dynamics and Lasers Conference, 23-26 June, Orlando, Fla., (2003)]. Wide bandgap semiconductor p-n junction devices have potential for operating temperatures greater than 3000° C.

An optical device with p and n regions can produce electric current when light or electromagnetic radiation is irradiated on the device. These devices are called photovoltaic cells. The photovoltaic device is fabricated using the same processing and p-n junction structure as our white SiC light emitting diode (LED). The laser doping technology can be used to create any semiconductor structure including transistor structures to create photovoltaic devices.

The p and n regions of the photovoltaic device were fabricated by laser doping a n-type 6H—SiC (as-received nitrogen concentration of $5 \times 10^{18}$ cm$^{-3}$) and p-type 4H—SiC (Al doped) (as received aluminum concentration $1 \times 10^{19}$ cm$^{-3}$) wafer substrates with respective dopants. Cr and Al were used as p-type dopants while N was used as n-type dopant. A Q-switched Nd:YAG pulse laser (1064 nm wavelength) was used to carry out the doping experiments. The experimental parameters for laser doping of Cr and N were: power 11-13 W, frequency 5-10 kHz for a spot size of 85-150 μm at a scan speed of 0.5-0.8 mm/s.

For n-type doping the sample was placed in a nitrogen atmosphere at pressure of 30 psi and laser-doped regions were formed on the sample surface by moving the chamber with a stepper motor-controlled translation stage. The height of the chamber was controlled manually through an intermediate stage to obtain different laser spot sizes on the SiC substrate.

For p-type doping, TMA (trimethylaluminum, (CH3)3Al) and Bis (ethyl benzene)-chromium were used. TMA was heated in a bubbler source immersed in a water bath maintained at 70° C. until it evaporated and then a carrier gas, argon, was passed through the bubbler to transport the TMA vapor to the laser doping chamber. Similarly, for chromium doping Bis (ethyl benzene)-chromium was heated in a bubbler source immersed in a water bath maintained at 100° C. until it evaporated and then a carrier gas, argon, was passed through the bubbler to transport the ethyl benzene chromium vapor to the laser doping chamber. These dopant gas species decompose at the laser-heated substrate surface producing Al and Cr atoms, which subsequently diffuse into the substrate.

Since crystalline SiC is chemically inert and has good thermo-mechanical properties at high temperatures, photovoltaic cells made of p-n regions in SiC can be located at the walls of combustion chambers to directly convert radiative energy into electrical energy; particularly in power plants. Burning fuels and the resultant flames produce electromagnetic radiation in the ultraviolet (UV), visible and infrared regions of the spectrum. The combustion chamber is modified to contain stacks of SiC photovoltaic cells so that each stack can absorb the radiation of a selected wavelength range to directly produce electricity.

Aluminum and Nickel were deposited on p and n regions respectively on the samples prior to photocurrent measurements to serve as contacts. Contacts can also be laser synthesized producing stable carbon rich conductors that can tolerate high temperatures beyond the capability of conventional materials such as Al and Ni.

Figure 16:
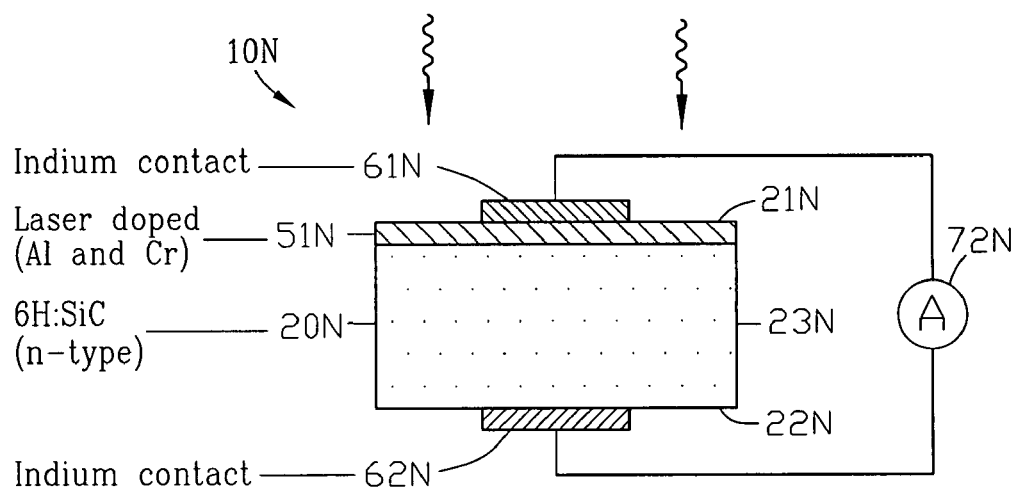
FIG. 16 is a side sectional view of a solid state photovoltaic device fabricated on 6H:SiC (n-type) substrate by doping with aluminum and chromium.

FIG. 16 is a side sectional view of a solid state photovoltaic device 10N fabricated on 6H:SiC (n-type) substrate by doping with aluminum and chromium. The substrate 20N defines a first and a second side 21N and 22N and a peripheral edge 23N. A first and a second Ohmic contact 61N and 62N are electrically connected to the first and second side 21N and 22N of the substrate 20N. The solid state photovoltaic device 10N produces an electric current between the first and second Ohmic contacts 61N and 62N upon receiving electromagnetic radiation as indicated by the ammeter 72 N.

Photocurrent measurements were conducted using a Keithley pico-ammeter/voltage source Model 6487 was used for carrying out the current measurements, while an Agilent digital multimeter Model 34401A was used for measuring the voltages and the resistances. The light source was a 50 W tungsten filament lamp.

With no visible light sources a background voltage and current existed in the SiC samples at room temperature (23° C.). Irradiation from a 50 W tungsten filament light source produced a greater than 220% voltage boost and a greater than 4350% current output boost in the laser doped 4H—SiC device. A greater than 540% voltage boost and a greater than 1250% current output boost was observed in the laser doped 6H—SiC device.

The mechanism for the observed photocurrent SiC is as follows. When a broadband source of light impinges on the doped SiC structure, the photons with different energies are absorbed, which creates electron hole pairs in the valence band. The photons with energies higher than the band gap of the substrate causes the electron to excite from the valence band (or from impurity levels created by dopants Cr, Al, N) to the conduction band (or same impurity levels). The electron flows through the contact wires generate current and the corresponding voltage.

The photovoltaic device can be laser doped with select dopants or combination of dopants to absorb energy from the complete electromagnetic spectrum. The photovoltaic device can be laser doped with select dopants or combination of dopants to select or filter the range of electromagnetic spectrum energy absorbed using the same laser doping methods described for the LED wavelength emission selectivity.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A solid state photovoltaic device, comprising:
  an indirect bandgap wide bandgap semiconductor material selected from the group consisting of silicon carbide, aluminum nitride, diamond, diamond like carbon, boron nitride and gallium phosphide;
  said wide bandgap semiconductor material having a first doped region;
  a second doped region formed in situ within a portion of said first doped region by directing a thermal energy beam onto said first doped region in the presence of a doping medium selected from the group consisting of Bis (ethyl benzene)-chromium; Eurpoium 2,2,6,6, Tetramethyl 3,5, heptanedionate and diethyl selenium;
  said doping medium including large diameter donor atoms having an atomic diameter greater than the largest diameter atom of the indirect wide bandgap semiconductor material to strain the first doped region of the indirect wide bandgap semiconductor material for converting a portion of said first doped region into a second doped region having direct bandgap properties; and
  a first and a second Ohmic contact connected to said first and the second doped regions of said wide bandgap semiconductor material.

2. The process of making a solid state energy conversion device for emitting white electromagnetic radiation upon excitation by electrical energy, comprising the steps of:
  providing a wide bandgap semiconductor material;
  applying first dopant atoms, second dopant atoms and third dopant atoms to a surface of the wide bandgap semiconductor material;
  directing a thermal energy beam onto the wide bandgap semiconductor material in the presence of the first, second and third dopant atoms for converting a region within the wide bandgap semiconductor material able to emit red electromagnetic radiation, green electromagnetic radiation and blue electromagnetic radiation upon excitation by electrical energy; and
  forming Ohmic conductors for exciting the region of the wide bandgap semiconductor material with electrical energy enabling the sum of the red, green and blue electromagnetic radiation producing a white electromagnetic radiation.

3. The process of making a solid state energy conversion device as set forth in claim 2 wherein the step of providing a wide bandgap semiconductor material comprises providing a wide bandgap semiconductor material selected from the group consisting of silicon carbide, aluminum nitride, diamond, diamond like carbon, boron nitride and gallium phosphide.

4. The process of making a solid state energy conversion device as set forth in claim 2 wherein the step of providing a wide bandgap semiconductor material comprises providing a silicon carbide wide bandgap semiconductor material.

5. The process of making a solid state energy conversion device as set forth in claim 2 wherein the step of applying first dopant atoms, second dopant atoms and third dopant atoms to a surface of the wide bandgap semiconductor material comprises applying doping atoms precursors selected from the group consisting of Bis (ethyl benzene)-chromium; Eurpoium 2,2,6,6, Tetramethyl 3,5, heptanedionate and diethyl selenium.

6. The process of making a solid state energy conversion device as set forth in claim 2 wherein the step of applying first dopant atoms, second dopant atoms and third dopant atoms to a surface of the wide bandgap semiconductor material comprises applying combinations of dopant atoms selected from the group consisting of N—Al—Cr, Al—Se—Cr, Al—Se—N and N—Al—Cr—Se, Cr—Se, V—N, and V—Al—N.

7. The process of making a solid state energy conversion device as set forth in claim 2 wherein the step of forming Ohmic conductors comprises depositing Ohmic conductors selected from the group consisting of indium, aluminum and laser synthesized carbon rich conductors.

8. The process of making a solid state energy conversion device as set forth in claim 2 wherein the solid state energy conversion device produces electromagnetic radiation upon the application of electrical energy having a color temperature that is between 5200 to 5500 degrees Kelvin.

9. The process of making a solid state energy conversion device as set forth in claim 2 wherein the solid state energy conversion device produces electromagnetic radiation upon the application of electrical energy having a wavelength from 400 nm to 900 nm.

10. The process of making a solid state energy conversion device for emitting white electromagnetic radiation upon excitation by electrical energy, comprising the steps of:
    providing a silicon carbide wide bandgap semiconductor material;
    applying nitrogen dopant atoms, chromium dopant atoms and aluminum dopant atoms to a surface of the silicon carbide wide bandgap semiconductor material;
    directing a thermal energy beam onto the silicon carbide wide bandgap semiconductor material in the presence of the nitrogen, chromium and aluminum dopant atoms for converting a region within the silicon carbide wide bandgap semiconductor material able to emit red electromagnetic radiation, green electromagnetic radiation and blue electromagnetic radiation upon excitation by electrical energy; and
    forming Ohmic conductors for exciting the region of the silicon carbide wide bandgap semiconductor material with electrical energy enabling the sum of the red, green and blue electromagnetic radiation producing a white electromagnetic radiation.

11. The process of making a solid state energy conversion device for emitting electromagnetic radiation upon excitation by electrical energy, comprising the steps of
    providing a wide bandgap semiconductor material;
    applying at least a first dopant atoms to a surface of the wide bandgap semiconductor material;
    directing a thermal energy beam onto the wide bandgap semiconductor material in the presence of at least the first dopant atoms to create at least a first donor-acceptor pair within the wide bandgap semiconductor material capable of emitting electromagnetic radiation upon the recombination of the first donor-acceptor pair upon excitation by electrical energy; and
    forming Ohmic conductors to the region of the wide bandgap semiconductor material for applying electrical energy for exciting the first donor-acceptor pair to emit electromagnetic radiation upon recombination of the first donor-acceptor pair.

12. The process of making a solid state energy conversion device as set forth in claim 11 wherein the step of applying the first dopant atoms to the surface of the wide bandgap semiconductor material comprises applying nitrogen to the surface of the wide bandgap semiconductor material to create a first donor-acceptor pair comprising N and other defect states within the wide bandgap semiconductor material capable of emitting red light upon the recombination of the first donor-acceptor pair.

13. The process of making a solid state energy conversion device as set forth in claim 11 including the step of applying the second dopant atoms to the surface of the wide bandgap semiconductor material comprises applying chromium to the surface of the wide bandgap semiconductor material to create a second donor-acceptor pair comprising N and chromium capable of emitting green light upon the recombination of the second donor-acceptor pair.

14. The process of making a solid state energy conversion device as set forth in claim 11 including the step of applying the third dopant atoms to the surface of the wide bandgap semiconductor material comprises applying aluminum to the surface of the wide bandgap semiconductor material to create a third donor-acceptor pair comprising N and aluminum capable of emitting blue light upon the recombination of the third donor-acceptor pair.

15. The process of making a solid state energy conversion device for producing electrical energy upon impingement of electromagnetic radiation, comprising the steps of:
    providing a wide bandgap semiconductor material;
    applying dopant atoms to a surface of the wide bandgap semiconductor material;
    directing a thermal energy beam onto the wide bandgap semiconductor material in the presence of the dopant atoms for converting a region within the wide bandgap semiconductor material able to produce electrical energy upon excitation by electromagnetic radiation; and
    forming Ohmic conductors for directing electrical energy from the region of the wide bandgap semiconductor material upon impingement of electromagnetic radiation onto the region of the wide bandgap semiconductor material.

* * * * *